(12) United States Patent
Kim et al.

(10) Patent No.: US 7,274,051 B2
(45) Date of Patent: Sep. 25, 2007

(54) FIELD EFFECT TRANSISTOR (FET) HAVING WIRE CHANNELS AND METHOD OF FABRICATING THE SAME

(75) Inventors: Sungmin Kim, Yongin (KR); Ming Li, Yongin (KR); Eungjung Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/074,900

(22) Filed: Mar. 9, 2005

(65) Prior Publication Data

US 2006/0049429 A1 Mar. 9, 2006

(30) Foreign Application Priority Data

Sep. 7, 2004 (KR) .............. 10-2004-0071225

(51) Int. Cl.
*H01L 29/76* (2006.01)
(52) U.S. Cl. ............ 257/213; 257/210; 257/241; 257/287; 257/E29.049
(58) Field of Classification Search ......... 257/213, 257/210, 241, 287, E29.049
See application file for complete search history.

(56) References Cited

U.S. PATENT DOCUMENTS

| | | | |
|---|---|---|---|
| 4,996,574 A | 2/1991 | Shiraski | 357/23.7 |
| 5,583,362 A | 12/1996 | Maegawa | 257/347 |
| 5,965,914 A * | 10/1999 | Miyamoto | 257/331 |
| 6,413,802 B1 | 7/2002 | Hu et al. | 438/151 |
| 6,583,014 B1 * | 6/2003 | Wu | 438/284 |
| 6,605,847 B2 | 8/2003 | Kim et al. | 257/401 |
| 2004/0007738 A1 * | 1/2004 | Fried et al. | 257/329 |
| 2004/0063286 A1 | 4/2004 | Kim et al. | 438/283 |
| 2005/0191795 A1 * | 9/2005 | Chidambarrao et al. | 438/142 |

* cited by examiner

*Primary Examiner*—Long K. Tran
(74) *Attorney, Agent, or Firm*—Lee & Morse, P.C.

(57) ABSTRACT

In a field effect transistor (FET), and a method of fabricating the same, the FET includes a semiconductor substrate, source and drain regions formed on the semiconductor substrate, a plurality of wire channels electrically connecting the source and drain regions, the plurality of wire channels being arranged in two columns and at least two rows, and a gate dielectric layer surrounding each of the plurality of wire channels and a gate electrode surrounding the gate dielectric layer and each of the plurality of wire channels.

41 Claims, 36 Drawing Sheets

FIELD EFFECT TRANSISTOR (FET) HAVING WIRE CHANNELS AND METHOD OF FABRICATING THE SAME

1. FIELD OF THE INVENTION

The present invention relates to a field effect transistor (FET) and a method of fabricating the same. More particularly, the present invention relates to an FET having a plurality of wire channels and a method of fabricating the same.

2. DESCRIPTION OF THE RELATED ART

As applications of semiconductor devices expand, highly-integrated and/or high-speed semiconductor devices are increasingly in demand. As an integration density of semiconductor devices increase, a design rule becomes smaller. As a result of a decreasing design rule, a channel length and a channel width of a field effect transistor (FET) similarly decrease. A decrease in channel length may result in a short channel effect. A decrease in channel width may result in a narrow channel effect. The short channel effect may significantly influence a potential in a source/drain region upon a channel region. The narrow channel effect may increase a threshold voltage. In an attempt to prevent generation of the short channel effect and/or the narrow channel effect, various FET having new structures have been proposed.

Recently, efforts have been made, particularly in an area of nano-size technology in the semiconductor field, to increase drive current of a transistor and decrease the short channel effect. Conventionally, several methods have been used in an effort to achieve these results. Examples of these attempts include a recessed channel array transistor (RCAT), a fin-type FET (FinFET), and a gate-all-around transistor (GAT). An example of a previous attempt is disclosed in U.S. Patent Application No. 2004/0063286, which is incorporated by reference herein.

Each of these conventional devices and the corresponding methods of fabricating these devices, suffer from one or more disadvantages. For example, these conventional devices are limited in an ability to perform fast operations. Moreover, the number of spaced channel layers in these conventional devices is limited due to fabrication limitations, e.g., with respect to an etching depth that can be achieved during dry etching.

Accordingly, an FET that is able to increase current load by using multiple wire channels and an FET that is able to decrease the short channel effect by controlling the wire channels and by separating the source and drain regions of the FET to prevent a punch-through phenomenon is needed.

SUMMARY OF THE INVENTION

The present invention is therefore directed to a field effect transistor (FET) having a plurality of wire channels and a method of fabricating the same, which substantially overcome one or more of the problems due to the limitations and disadvantages of the related art.

It is a feature of an embodiment of the present invention to provide an FET having a plurality of wire channels and a method of fabricating the same that is able to prevent generation of a short channel effect and a narrow channel effect.

It is another feature of an embodiment of the present invention to provide an FET having a plurality of wire channels and a method of fabricating the same that is able to increase an operating speed of a corresponding semiconductor device.

It is still another feature of an embodiment of the present invention to provide an FET having a plurality of wire channels and a method of fabricating the same in which wire channels are completely surrounded by a gate electrode, which facilitates control of the channel by the gate electrode, thereby preventing a short channel effect and minimizing an inversion region formed on an exterior surface of the wire channel.

It is yet another feature of an embodiment of the present invention to provide an FET having a plurality of wire channels and a method of fabricating the same in which a width of the channel is increased to prevent a narrow channel effect.

At least one of the above features and other advantages may be provided by a field effect transistor (FET) including a semiconductor substrate, source and drain regions formed on the semiconductor substrate, a plurality of wire channels electrically connecting the source and drain regions, the plurality of wire channels being arranged in two columns and at least two rows, and a gate dielectric layer surrounding each of the plurality of wire channels and a gate electrode surrounding the gate dielectric layer and each of the plurality of wire channels.

In this FET, each of the plurality of wire channels may be formed of monocrystalline silicon. Each of the plurality of wire channels in an uppermost row may have a first size and each of the plurality of wire channels in a lowermost row may have a second size, and the first size and the second size may be different. The first size may be less than the second size. The first size may be greater than the second size.

In addition, the number of rows of the plurality of wire channels may be three. In this case, a middle row may have a third size, which may be between the first size and the second size. A size of each row of the plurality of wire channels may be less than a size of a lower row of the plurality of wire channels and greater than a size of an upper row of the plurality of wire channels so that the plurality of wire channels in the uppermost row may have the smallest size and the plurality of wire channels in the lowest row may have the largest size.

At least one of the above features and other advantages may be provided by a field effect transistor (FET) including a semiconductor substrate, source and drain regions formed on the semiconductor substrate, a plurality of wire channels formed of monocrystalline silicon, the plurality of wire channels electrically connecting the source and drain regions, the plurality of wire channels being arranged in two columns and at least one row, a gate dielectric layer surrounding each of the plurality of wire channels and a gate electrode surrounding the gate dielectric layer and each of the plurality of wire channels.

In either FET, the semiconductor substrate may be monocrystalline silicon or a silicon-on-insulator (SOI) substrate. The source and drain regions may be formed of a material selected from the group consisting of monocrystalline silicon, polysilicon, metal, and metal silicide.

Each of the plurality of wire channels may have a substantially square shape and a thickness of each of the plurality of wire channels may be less than about 30 nm. Alternatively, each of the plurality of wire channels may have a substantially round shape and each of the plurality of wire channels may have a diameter of less than about 30 nm.

Either FET may further include a channel formation preventing layer formed in an upper region of the semiconductor substrate between the source and drain regions, the channel formation preventing layer being operable to prevent operation of a bottom transistor. The channel formation preventing layer may be formed of an insulative material or an impurity-doped region of the semiconductor substrate.

Either FET may further include a short-circuit prevention insulating layer interposed between the source and drain regions and the gate electrode, the short-circuit prevention insulating layer being operable to prevent a short-circuit between the source and drain regions and the gate electrode. The short-circuit prevention insulating layer may be a silicon thermal oxide or a silicon oxide.

The source and drain regions may be separated from the semiconductor substrate by a predetermined distance.

An upper surface of the uppermost row of wire channels may be level with an upper surface of the source and drain regions. Alternatively, an upper surface of the uppermost row of wire channels may be lower than an upper surface of the source and drain regions.

The gate dielectric layer may be a silicon thermal oxide film and may have a thickness of between about 50-100 Å.

The gate electrode may be a single film formed of impurity-doped polysilicon, metal silicide, or metal impurity doped polysilicon. Alternatively, the gate electrode may be a composite film formed of at least two layers of impurity-doped polysilicon, metal silicide, or metal impurity.

At least one of the above features and other advantages may be provided by a method of fabricating a field effect transistor (FET) including forming a channel forming preparation layer on the semiconductor substrate, the channel forming preparation layer including a first sacrificial layer, a first channel layer, a second sacrificial layer, and a second channel layer sequentially stacked on the semiconductor substrate, forming a hard mask layer on the channel forming preparation layer, patterning the hard mask layer and the channel forming preparation layer to define an active region of the semiconductor substrate, patterning the hard mask layer to narrow the hard mask layer, thereby exposing an edge portion of an upper surface of the channel forming preparation layer, forming a first dielectric layer on the semiconductor substrate to cover the narrowed hard mask layer and the channel forming preparation layer, then planarizing the first dielectric layer to expose the narrowed hard mask layer, patterning the first dielectric layer and a portion of the narrowed hard mask layer to remove a portion of the narrowed hard mask layer, thereby forming a dummy gate pattern and exposing a portion of the channel forming preparation layer, selectively etching the exposed portion of the channel forming preparation layer adjacent to the dummy gate pattern to expose the semiconductor substrate, selectively growing an epitaxial layer on the exposed semiconductor substrate to form source and drain patterns adjacent to the channel forming preparation layer, forming a second dielectric layer on the semiconductor substrate including the dummy gate and the source and drain patterns and then planarizing the second dielectric layer to expose the dummy gate pattern, selectively etching the remaining hard mask layer to remove the remaining hard mask layer, thereby exposing a portion of the channel forming preparation layer and then etching the exposed portion of the channel forming preparation layer to expose the semiconductor substrate, removing the second dielectric layer and an upper portion of the first dielectric layer to expose sidewalls of the channel forming preparation layer remaining on the semiconductor substrate, selectively etching the channel forming preparation layer to remove the first and second sacrificial layers, thereby forming a plurality of wire channels from the first and second channel layers, forming a gate dielectric layer on the semiconductor substrate to surround each of the plurality of wire channels, forming a gate electrode on the gate dielectric layer to form a gate surrounding each of the plurality of wire channels.

At least one of the above features and other advantages may be provided by a method of fabricating a field effect transistor (FET) including forming a channel forming preparation layer on the semiconductor substrate, the channel forming preparation layer including a sacrificial layer and a channel layer sequentially stacked on the semiconductor substrate, the channel layer being formed of monocrystalline silicon, forming a hard mask layer on the channel forming preparation layer, patterning the hard mask layer and the channel forming preparation layer to define an active region of the semiconductor substrate, patterning the hard mask layer to narrow the hard mask layer, thereby exposing an edge portion of an upper surface of the channel forming preparation layer, forming a first dielectric layer on the semiconductor substrate to cover the narrowed hard mask layer and the channel forming preparation layer, then planarizing the first dielectric layer to expose the narrowed hard mask layer, patterning the first dielectric layer and a portion of the narrowed hard mask layer to remove a portion of the narrowed hard mask layer, thereby forming a dummy gate pattern and exposing a portion of the channel forming preparation layer, selectively etching the exposed portion of the channel forming preparation layer adjacent to the dummy gate pattern to expose the semiconductor substrate, selectively growing an epitaxial layer on the exposed semiconductor substrate to form source and drain patterns adjacent to the channel forming preparation layer, forming a second dielectric layer on the semiconductor substrate including the dummy gate and the source and drain patterns and then planarizing the second dielectric layer to expose the dummy gate pattern, selectively etching the remaining hard mask layer to remove the remaining hard mask layer, thereby exposing a portion of the channel forming preparation layer and then etching the exposed portion of the channel forming preparation layer to expose the semiconductor substrate, removing the second dielectric layer and an upper portion of the first dielectric layer to expose sidewalls of the channel forming preparation layer remaining on the semiconductor substrate, selectively etching the channel forming preparation layer to remove the sacrificial layer, thereby forming a plurality of monocrystalline silicon wire channels from the channel layer, forming a gate dielectric layer on the semiconductor substrate to surround each of the plurality of wire channels, forming a gate electrode on the gate dielectric layer to form a gate surrounding each of the plurality of wire channels.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 5A through 17D illustrate stages in a method of fabricating an FET according to an exemplary embodiment of the present invention, in which FIGS. 5A, 6A, . . . , and 17A illustrate schematic perspective views of the FET, FIGS. 5B, 6B, . . . , and 17B illustrate cross-sections taken along line X-X' of FIGS. 5A, 6A, . . . , and 17A, respectively, FIGS. 5C, 6C, . . . , 13C, and 17C illustrate cross-sections taken along line $Y_1$-$Y_1'$ of FIGS. 5A, 6A, . . . , and 17A, respectively, and FIGS. 12D, 13D, 14C, 15C, 16C and 17D illustrate cross-sections taken along line $Y_2$-$Y_2'$ of FIGS. 12A, 13A, . . . , and 17A, respectively; and FIGS. 18A through 21C illustrate stages in a method of fabricating an FET according to another exemplary embodiment of the present invention, in which FIGS. 18A, 19A, 20A, and 21A illustrate schematic perspective views of the FET transistor, FIGS. 18C, 19C, 20C, and 21C illustrate cross-sectional views taken along line $Y_1$-$Y_1'$ of FIGS. 18A, 19A, 20A, and 21A, respectively.

DETAILED DESCRIPTION OF THE INVENTION

Figure 1A:
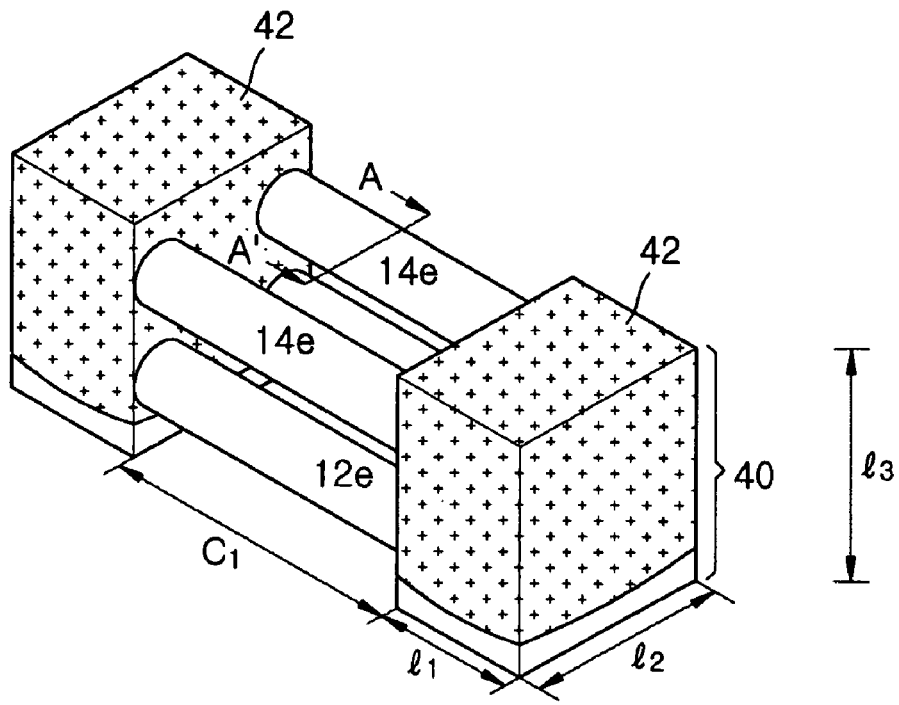
FIGS. 1A through 1C illustrate perspective views of active patterns of a field effect transistor (FET) according to various embodiments of the present invention.

Korean Patent Application No. 2004-71225, filed on Sep. 7, 2004, in the Korean Intellectual Property Office, and entitled: "Metal-Oxide-Semiconductor Transistor Comprising Multiple Wire Bridge Channels and Method of Manufacturing the Metal-Oxide-Semiconductor Transistor," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals in different drawings represent like elements.

Field Effect Transistor (FET)

Figure 1B:
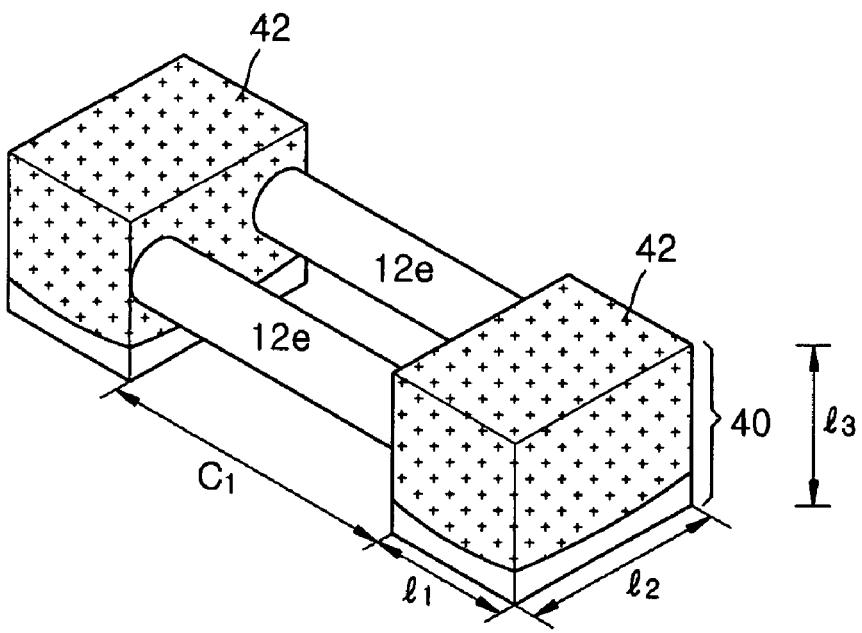
Figure 1C:
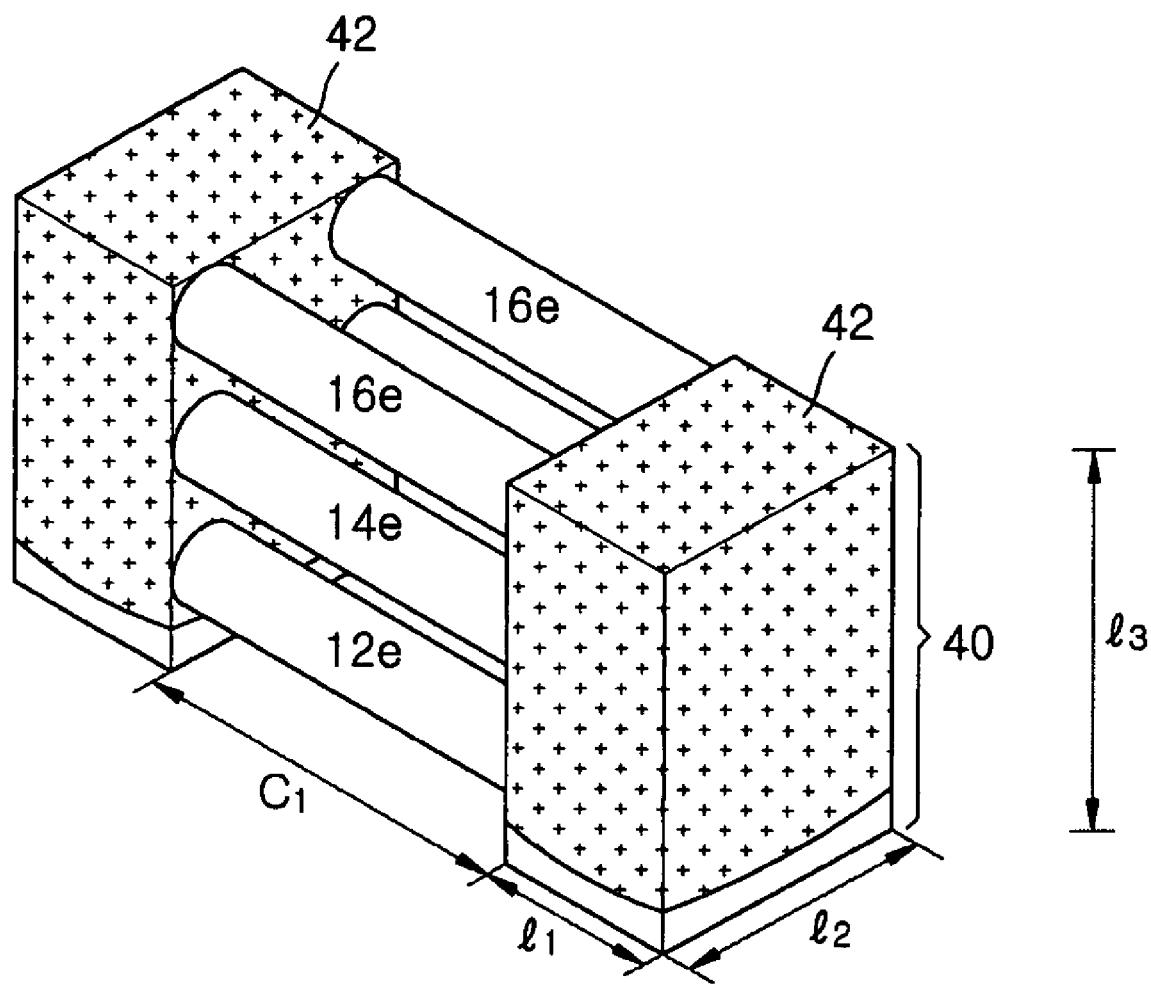

FIGS. 1A through 1C illustrate perspective views of active patterns of a field effect transistor (FET) according to various embodiments of the present invention.

Referring to FIG. 1A, an active pattern of an FET includes a pair of source/drain patterns 40, having corresponding source/drain regions 42, and a plurality of lower wire channels 12e and upper wire channels 14e. The lower and upper wire channels 12e and 14e electrically connect the source/drain regions 42. Although not illustrated, the active pattern may be formed on a semiconductor substrate.

The wire channels 12e, 14e may be parallel to a bottom surface of each of the source/drain patterns 40 or an upper surface of a semiconductor substrate (100 of FIG. 3A), which is below the source/drain patterns 40.

The source/drain patterns 40 may be formed to each have a predetermined thickness, a predetermined width, and a predetermined length. For example, the source/drain patterns 40 may be rectangular solids, as illustrated. Each of the source/drain patterns 40 may be set to have an appropriate size, for example, $l_1 \times l_2 \times l_3$, in consideration of electrical characteristics of a source/drain of an FET. In FIGS. 1A through 1C, a thickness $l_1$ of each of the source/drain patterns 40 is set to an appropriate size in consideration of a design rule. A width $l_2$ of each of the source/drain patterns 40 is set to an appropriate size in consideration of the design rule, sizes of the wire channels 12e and 14e, the number of columns of wire channels and an interval between adjacent columns. A height $l_3$ of each of the source/drain patterns 40 is set to an appropriate size in consideration of the design rule, the sizes of the wire channels 12e and 14e, the number of rows of wire channels, and the interval between adjacent rows.

The source/drain regions 42 are defined within the source/drain patterns 40. The source/drain regions 42 may occupy an entire area of corresponding source/drain patterns 40, as may be seen in FIG. 4A, or may occupy only a portion of the entire area of the source/drain patterns 40, as may be seen in, e.g., FIGS. 1A through 1C and FIGS. 3A, 3C and 3D. Accordingly, as may be seen in FIGS. 3A, 3C and 3D, there may be a gap between a semiconductor substrate 100 and the source/drain regions 142 within the source/drain patterns 140. Thus, bottom surfaces of the source/drain regions 42 may be level with or higher than bottom surfaces of the source/drain patterns 40. It is preferable to separate the source/drain regions from the semiconductor substrate, i.e., the latter case, to prevent a channel from forming within the semiconductor substrate located below the source/drain patterns 40. In addition, this arrangement is able to reduce leakage current from flowing into the semiconductor substrate.

The source/drain patterns 40 may be formed of monocrystalline silicon (Si), polysilicon, metal, metal silicide, or another suitable material. When the source/drain patterns 40 are formed of monocrystalline Si or polysilicon, the source/drain regions 42 may be implanted with impurity ions to define the source/drain regions 42. When the source/drain patterns 40 are formed of metal or metal silicide, the source/drain regions 42 occupy the entire area of the source/drain patterns 40. When the source/drain patterns 40 are implanted with impurity ions, bottom surfaces of the source/drain regions 42 may be controlled to be equal to or higher than the bottom surfaces of the source/drain patterns 40. In addition, the source/drain regions 42 may be formed to have predetermined doping profiles in a direction perpendicular to at least two rows of wire channels 12e and 14e. Thus, although a number of rows of wire channels 12e and 14e may increase, a uniform source/drain junction capacitance may be maintained.

FIG. 1A illustrates an exemplary arrangement in which the wire channels 12e and 14e, which are formed of monocrystalline Si, are arrayed in two rows×two columns, each separated from another by a predetermined distance. In the present invention, wire channels may be arrayed in at least one row and at least two columns.

Although an exemplary arrangement of two rows and two columns of wire channels is primarily illustrated, the present invention is not limited to such a configuration. For example, a single row of wire channels may be formed as shown in FIG. 1B or three rows of wire channels may be formed as shown in FIG. 1C. FIG. 1B illustrates an exemplary arrangement in which the wire channels 12e, which are formed of monocrystalline Si, are arrayed in one row×two columns. Thus, FIG. 1B includes only the two lower wire channels 12e arrayed in a single row. FIG. 1C illustrates another exemplary arrangement in which wire channels 12e, 14e and 16e, which are formed of monocrystalline Si, are arrayed in three rows×two columns. Thus, FIG. 1C includes two lower wire channels 12e, two middle wire channels 14e, and two upper wire channels 16e.

Figure 1D:
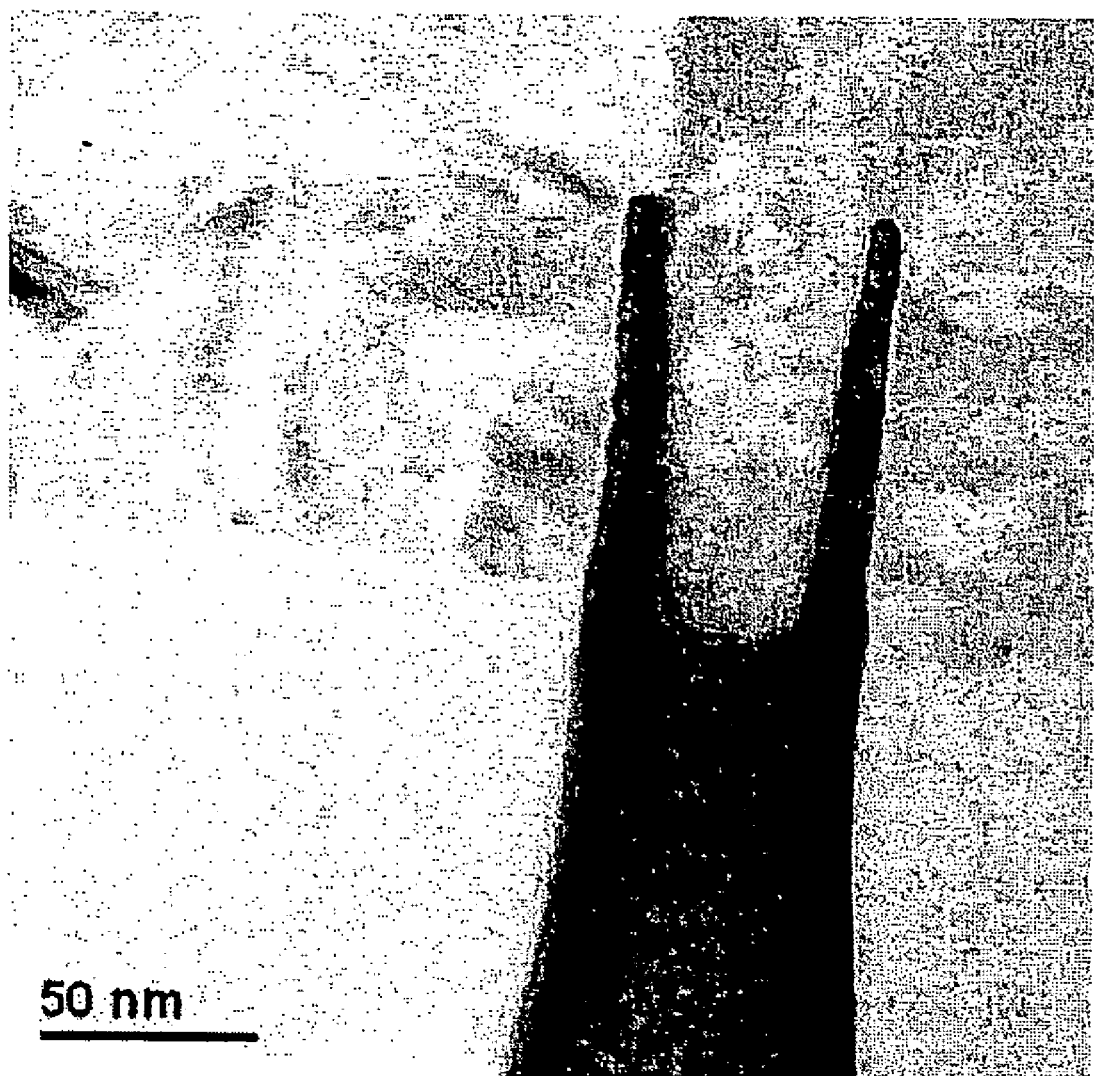
FIG. 1D is a vertical scanning electron microscope photograph of an FET according to an embodiment of the present invention.

FIG. 1D is a vertical scanning electron microscope photograph of an FET according to an embodiment of the present invention.

Figure 22:
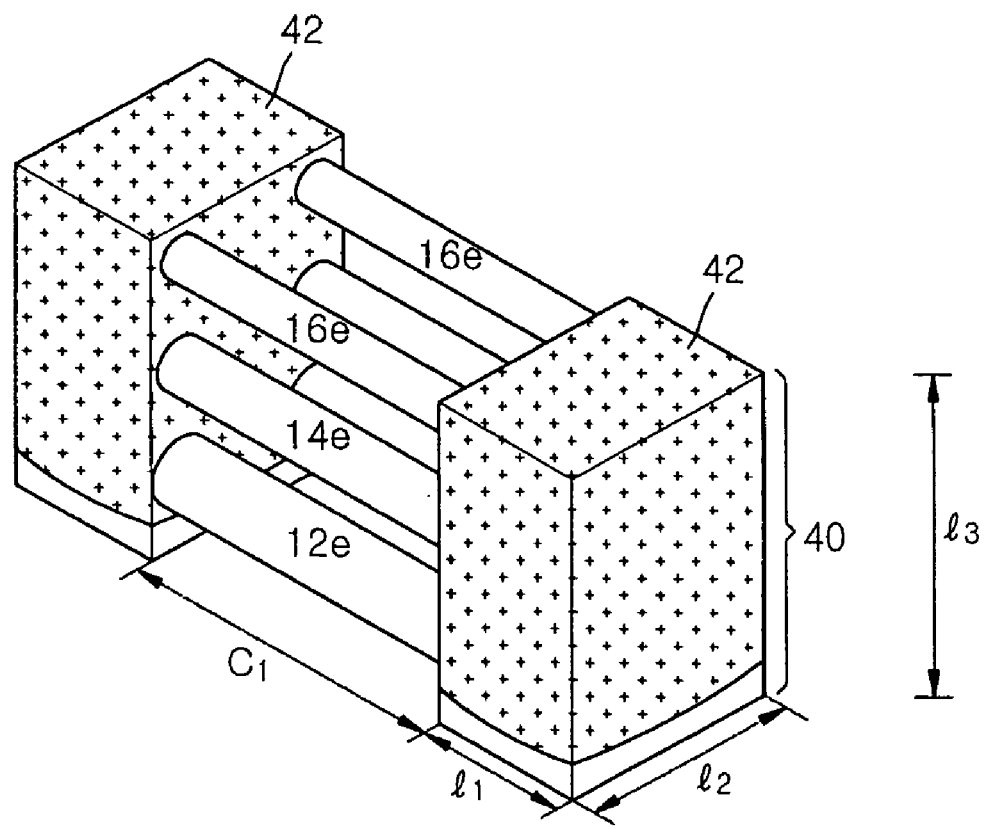
FIG. 22 illustrates a perspective view of active patterns of a FET according to another embodiment of the present invention.

As may be seen in FIG. 1D, each of the plurality of wire channels in an uppermost row has a first size, e.g., a diameter or a width, and each of the plurality of wire channels in a lowermost row has a second size, and the first size and the second size are different. In FIG. 1D, the first size is illustrated as being less than the second size. In an embodiment including three rows, as shown in FIG. 1C, a middle row may have a third size, which is between the first size and the second size. Thus, a size of a middle row 14e of the plurality of wire channels may be less than a size of a lower row 12e' of the plurality of wire channels and greater than a size of an upper row 16e' of the plurality of wire channels so that the plurality of wire channels in the uppermost row may have the smallest size and the plurality of wire channels in the lowest row may have the largest size, as illustrated in FIG. 22.

As described above, a bottom surface of a lowermost row of wire channels 12e may be equal to or higher than a bottom surface of the source/drain patterns 40. Preferably, the bottom surface of the lowermost row of wire channels is higher than the bottom surface of the source/drain patterns, thereby providing a gap between the wire channels 12e and the semiconductor substrate. When the bottom surface of the lowermost row of wire channels 12e is equal to the bottom surface of the source/drain patterns 40, the wire channels 12e in the lowermost row contact the semiconductor substrate 100, thereby allowing current flowing through the wire channels 12e to leak into the semiconductor substrate 100.

In addition, upper surfaces of the wire channels in the uppermost row, e.g., 14e in FIG. 1A, may be equal to upper surfaces of the source/drain patterns 40 (as may be seen in FIG. 1C) or lower than the upper surfaces of the source/drain patterns 40 (as may be seen in FIGS. 1A and 1B). It is preferable to form the upper surfaces of the wire channels in the uppermost row to be lower than the upper surfaces of the source/drain patterns 40 to prevent damage to the wire channels 14e in the uppermost row during the fabrication of the FET, thereby improving the reliability of the FET.

Lengths $C_1$ of the wire channels 12e and 14e are set to appropriate sizes in consideration of a design rule and other considerations. A cross-sectional shape and/or size of each wire channel may be set adequately to improve electrical characteristics, particularly, current characteristics, of the FET. The cross-sectional shapes of the wire channels 12e and 14e may preferably be shapes in which isotropic channels can be formed. For example, a wire channel according to an embodiment of the present invention may have a substantially square, rectangular, oval, or circular cross-sectional shape. In addition, a cross-sectional size of each wire channel may be less than about 30 nm to form completely depleted channels. Although exemplarily cross-sectional shapes and sizes are discussed herein, the cross-sectional shapes and sizes of the wire channels of the present invention are not limited to these exemplary shapes and sizes.

Figure 2:
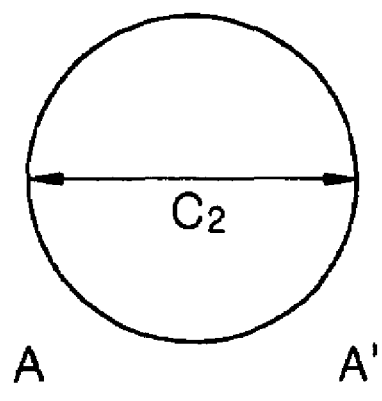
FIG. 2 illustrates a cross-section taken along line A-A' of FIG. 1A.
Figure 2:
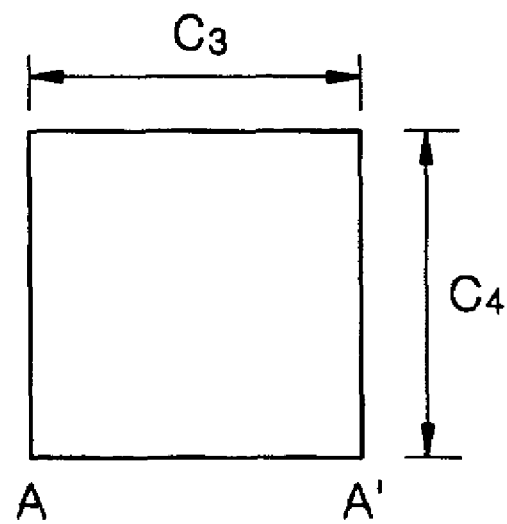

FIG. 2 illustrates various examples of cross-sectionals shapes of a wire channel taken along line A-A' of FIG. 1A. Referring to FIG. 2, the wire channels 12e and 14e may have substantially circular, square, oval, or rectangular cross-sections. When the wire channels 12e and 14e have substantially circular cross-sections, shapes of the wire channels 12e and 14e viewed from all directions are almost the same. Thus, when a predetermined voltage is applied to a gate electrode, a uniform electric field can be formed within the wire channels 12e and 14e. Wire channels 112e and 114e having substantially circular cross-sections serve as completely isotropic channels, and thus, more current flows in the wire channels having substantially circular cross-sections than in wire channels having substantially rectangular cross-sections.

Preferably, the cross-sections of the wire channels 12e and 14e are large enough to completely deplete the entire channel when the predetermined voltage is applied to the gate electrode. Cross-sectional sizes $C_2$, $C_3$, and $C_4$ that render the wire channels 12e and 14e a complete-depletion type may vary depending on a gate voltage, a property and a thickness of a gate insulative film, and a doping level of a channel. If an inversion layer is about 10 nm thick, as in current planar transistors, the cross-sectional sizes $C_2$, $C_3$, and $C_4$ of the wire channels 12e and 14e may preferably be between about 10 to 40 nm, more preferably, less than 30 nm, e.g., about 25 nm.

Figure 3A:
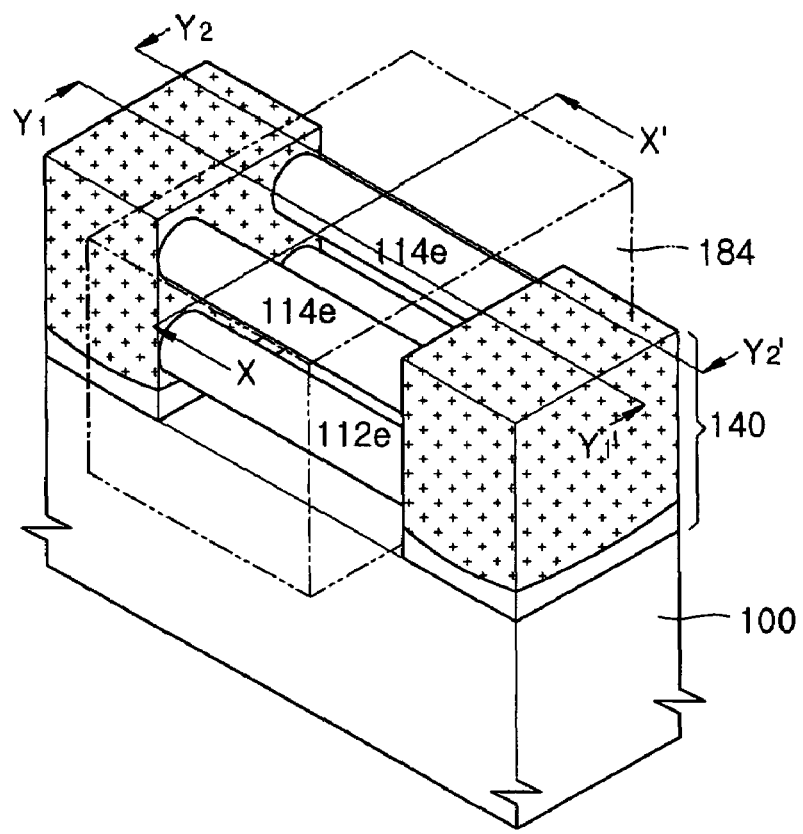
FIG. 3A illustrates a schematic perspective view of an FET according to an embodiment of the present invention.
Figure 3B:
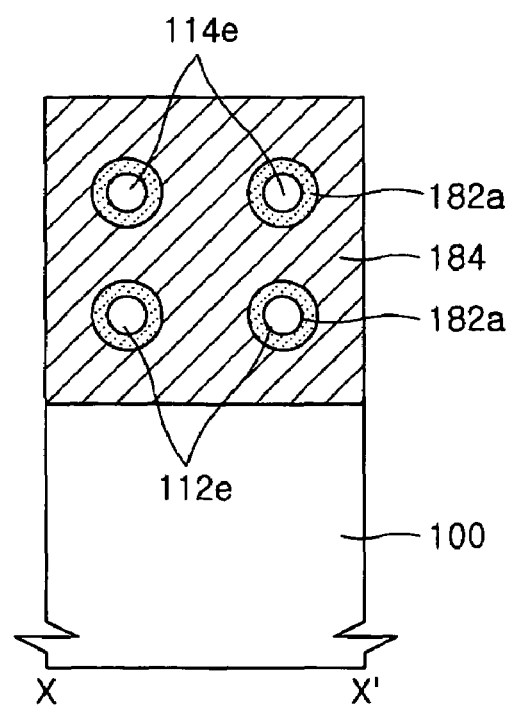
FIG. 3B illustrates a cross-section taken along line X-X' of FIG. 3A.
Figure 3C:
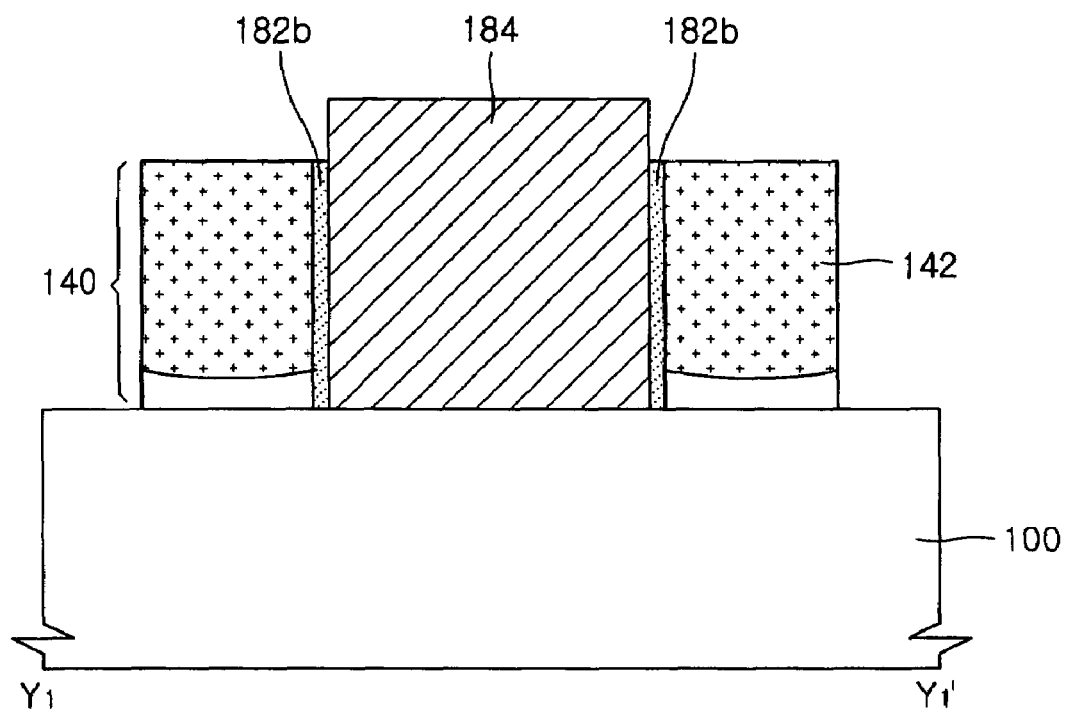
FIG. 3C illustrates a cross-section taken along line $Y_1$-$Y_1'$ of FIG. 3A.
Figure 3D:
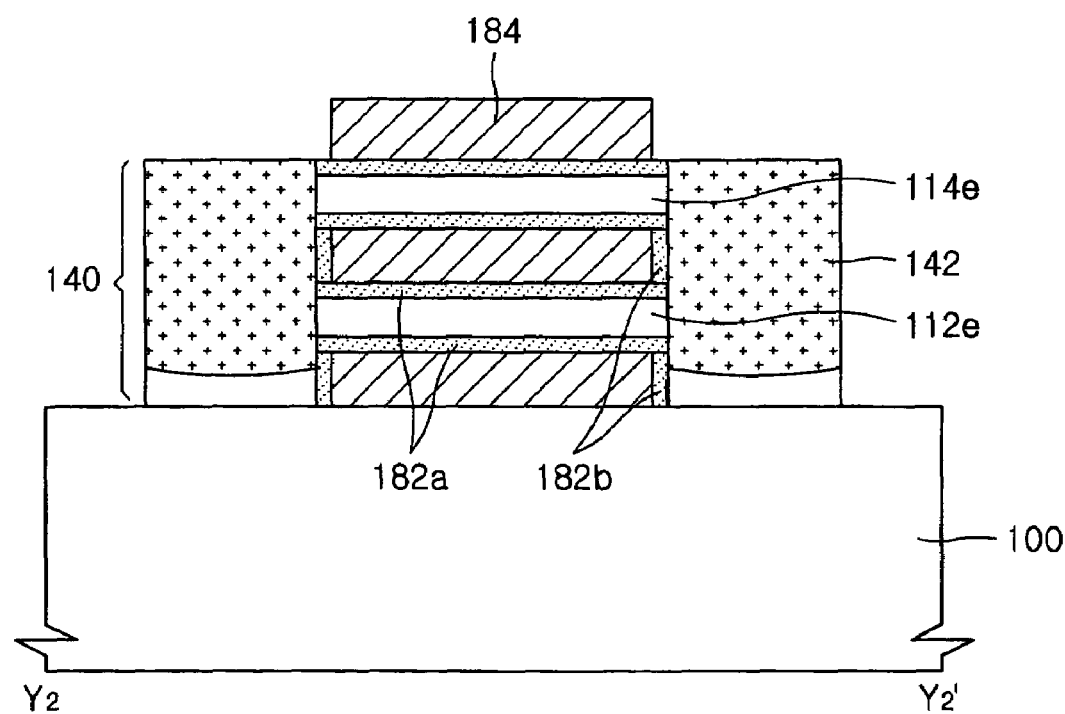
FIG. 3D illustrates a cross-section taken along line $Y_2$-$Y_2'$ of FIG. 3A.

FIG. 3A illustrates a schematic perspective view of an FET according to an embodiment of the present invention. FIGS. 3B, 3C, and 3D illustrate cross-sections taken along lines X-X', $Y_1$-$Y_1$', and $Y_2$-$Y_2$', respectively, of FIG. 3A.

Referring to FIGS. 3A through 3D, the FET includes a semiconductor substrate 100, a pair of source/drain patterns 140 including corresponding source/drain regions 142, an exemplary two×two array of wire channels 112e and 114e, a gate insulating film 182a, and a conductive pattern 184 for use as a gate electrode. The source/drain patterns 140 and the two×two array of wire channels 112e and 114e, which constitute an active pattern, are substantially identical to those elements previously described, and a description thereof will not be repeated. In the present embodiment, cross-sections of the wire channels 112e and 114e are substantially circular. Alternatively, the cross-sections of the wire channels 112e and 114e may be substantially oval.

The semiconductor substrate 100 may be formed of a semiconductor material, e.g., monocrystalline Si. For example, the semiconductor substrate 100 may be a bulk Si substrate or a silicon-on-insulator (SOI) substrate. An isolation region (not shown) may be formed in the semiconductor substrate 100. In this case, the active pattern is located on a portion of the semiconductor substrate 100 other than the portion where the isolation region is formed.

The source/drain regions 142, which are defined within the source/drain patterns 140, and the wire channels 112e and 114e are not defined in the semiconductor substrate 100 but on the semiconductor substrate 100. The source/drain patterns 140 are separated from each other by a predetermined distance on the semiconductor substrate 100. The wire channels 112e and 114e are interposed between the source/drain patterns 140 to electrically connect the source/drain regions 142.

The gate dielectric layer 182a, e.g., a gate insulating film, is formed on and around outer circumferences of each the wire channels 112e and 114e. More specifically, the gate insulating film 182a is interposed between the conductive pattern 184 for use as a gate electrode and the wire channels 112e and 114e. The gate insulating film 182a may be an Si thermal oxide film, and may have an appropriate thickness in consideration of a design rule or electrical characteristics of a semiconductor device. For example, the gate insulating film 182a may be an Si thermal oxide film having a thickness of about 50 to 100 Å.

The conductive pattern 184 for use as a gate electrode surrounds the gate insulating film 182a and is provided between the source/drain patterns 140. As shown in FIG. 3A, the conductive pattern 184 for use as a gate electrode may be elongated in a direction perpendicular to a direction in which the wire channels 112e and 114e extend, and may form a gate line together with a conductive pattern for gate electrodes of an adjacent cell to serve as a word line.

The conductive pattern 184 for use as a gate electrode may be a single film formed of a conductive material, e.g., impurity-doped polysilicon, metal silicide, or metal, or a composite film formed of at least two of the conductive materials, e.g., polysilicon and a conductive material having a specific resistance smaller than that of the polysilicon. In the present embodiment, the conductive pattern 184 for use as a gate electrode may be a single film formed of polysilicon.

A short-circuit prevention insulating layer 182b may additionally be provided in an FET according to the present invention. In the present embodiment, as shown in FIGS. 3C and 3D, the short-circuit prevention insulating layer 182b is provided between the conductive pattern 184 for use as a gate electrode and the source/drain patterns 140 to prevent the conductive pattern 184 from contacting the source/drain patterns 140. The short-circuit prevention insulating layer 182b may be a single insulating film or a composite insulating film. Although the insulating material forming the short-circuit prevention insulating layer 182b is not strictly limited, in view of a fabrication process of the FET, it is preferable that the short-circuit prevention insulating layer 182b is an Si thermal oxide formed during a thermal oxidation for forming the gate insulating film 182a or of a silicon oxide ($SiO_2$) deposited during formation of an interlayer insulating film, which is subsequent to the formation of the conductive pattern 184 for use as a gate electrode.

Figure 4A:
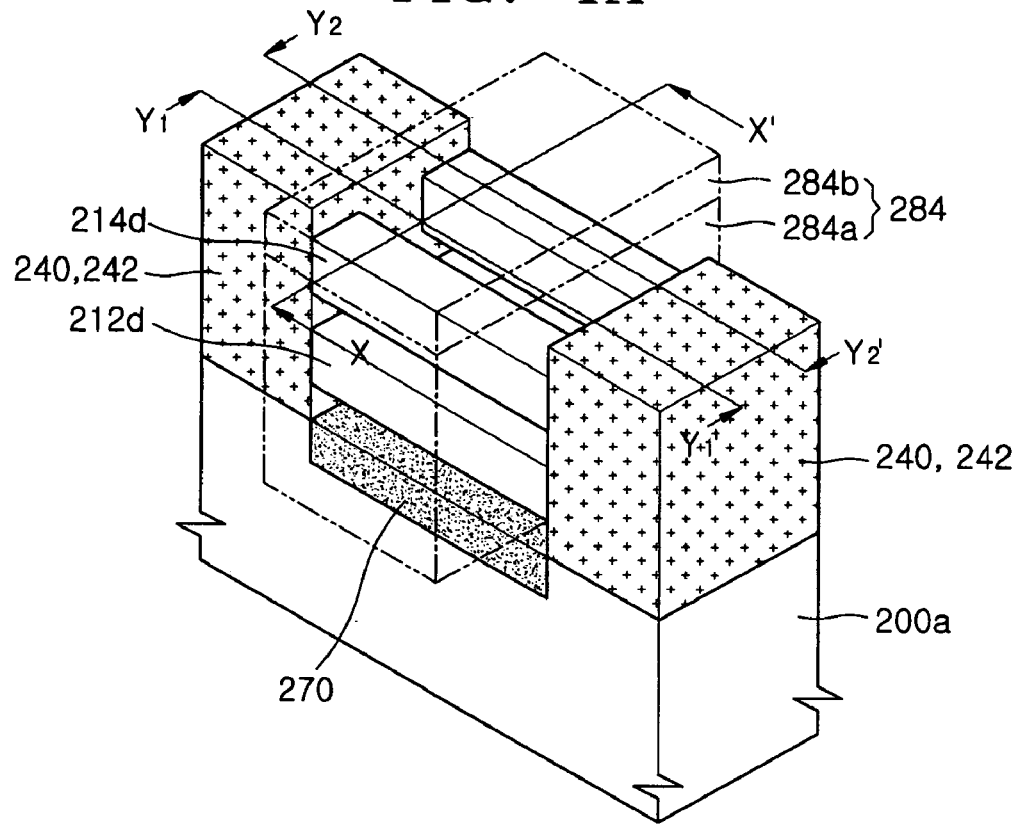
FIG. 4A illustrates a schematic perspective view of an FET according to another embodiment of the present invention.
Figure 4B:
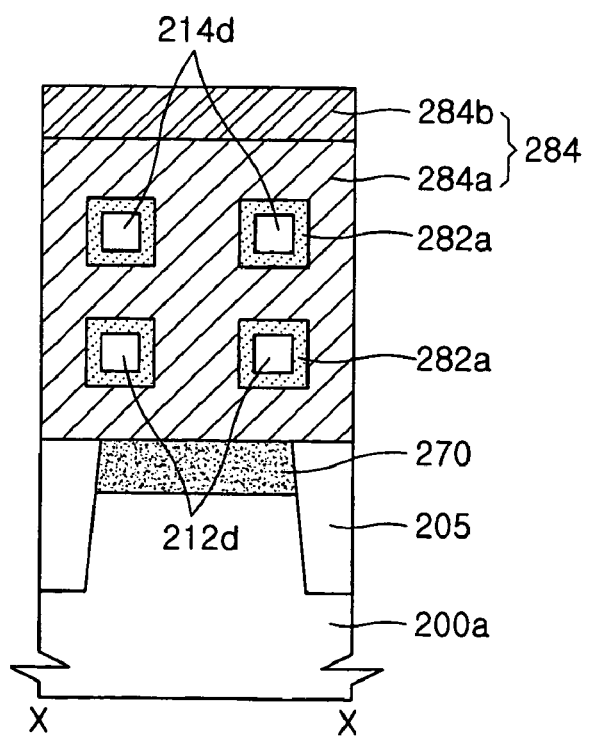
FIG. 4B illustrates a cross-section taken along line X-X' of FIG. 4A.
Figure 4C:
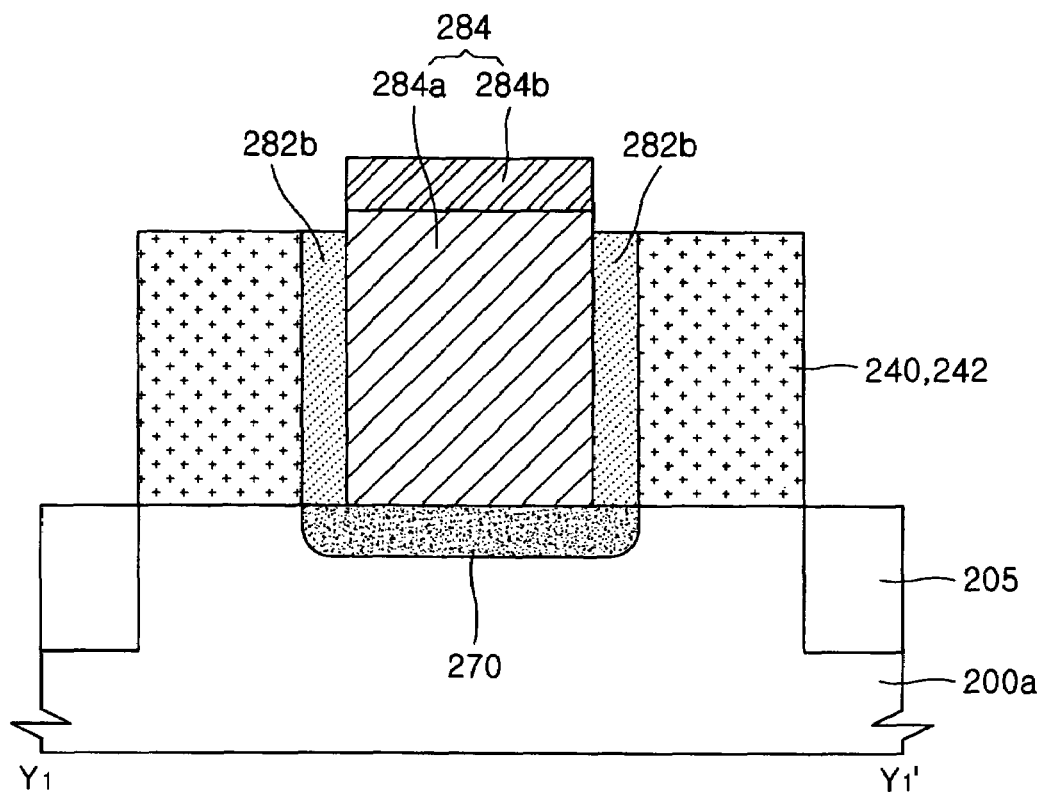
FIG. 4C illustrates a cross-section taken along line $Y_1$-$Y_1'$ of FIG. 4A.
Figure 4D:
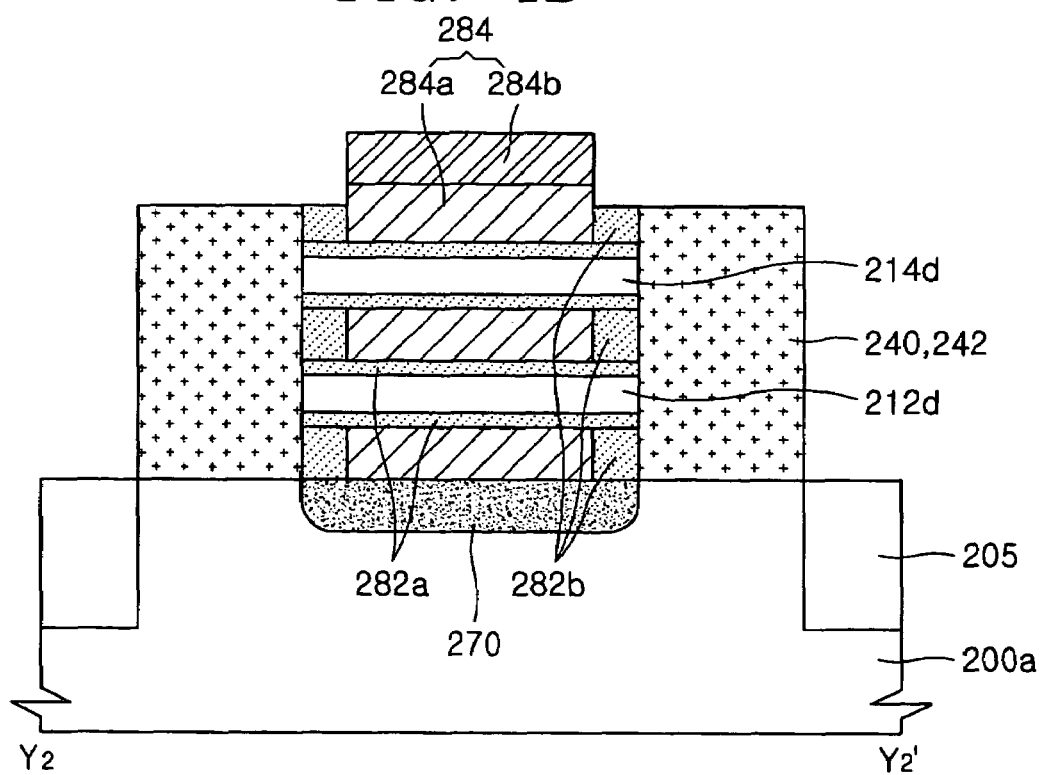
FIG. 4D illustrates a cross-section taken along line $Y_2$-$Y_2'$ of FIG. 4A.

FIG. 4A illustrates a schematic perspective view of an FET according to another embodiment of the present invention. FIGS. 4B, 4C, and 4D illustrate cross-sections taken along lines X-X', $Y_1$-$Y_1$', and $Y_2$-$Y_2$', respectively, of FIG. 4A.

Referring to FIGS. 4A through 4D, an isolation region 205 is formed in a semiconductor substrate 200a. The isolation region 205 is formed of an insulating material, such as, $SiO_2$. A region of the semiconductor substrate 200a surrounded by the isolation region 205 is an active region.

A channel formation preventing layer 270 is formed in the active region of the semiconductor substrate 200a. The channel formation preventing layer 270 prevents a channel from being formed within the semiconductor substrate 200a. More specifically, the channel formation preventing layer 270 prevents operation of a bottom transistor that may cause a short channel effect, particularly when the interval between the source/drain patterns 240 is narrow. The channel formation preventing layer 270 may be formed in a region of the semiconductor substrate 200a above which wire channels 212d and 214d are located. In this case, the channel formation preventing layer 270 extends downward from an upper surface of the semiconductor substrate 200a by a predetermined depth.

The channel formation preventing layer 270 may be an insulative material layer or, more preferably, a region doped with impurities ions with a high concentration to prevent movement of carriers. If a p-type semiconductor substrate 200a, which is doped with p+ impurity ions, is used and the carriers are electrons, the channel formation preventing layer 270 may be a portion of the p-type semiconductor substrate 200a.

In the present embodiment, source/drain regions 242 occupy an entire area of the source/drain patterns 240. Even when the source/drain regions 242 occupy the entire area of the source/drain patterns 240, the source/drain patterns 240 may be formed of a conductive material, e.g., monocrystalline Si, polysilicon, metal, metal silicide, or other conductive material. When the source/drain regions 242 occupy the entire area of the source/drain patterns 240, there is an increased possibility that a base transistor operates.

According to the present invention, the wire channels 212d and 214d may have cross-sectional shapes of substantially square or rectangular, as opposed to conventional plate shapes. In this embodiment of the present invention, the wire channels 212d and 214d have a substantially square cross-sectional shape, as may be seen in FIG. 4B.

The wire channels 212d and 214d have cross-sections with sizes of about 10 to 40 nm, so they may form complete depletion type channels. As described above, the wire channels 212d and 214d are arrayed in two rows×two columns. Moreover, upper surfaces of upper wire channels 214d are lower than upper surfaces of the source/drain patterns 240.

In this embodiment of the present invention, the conductive pattern 284 for the gate electrode is a composite film of a polysilicon film 284a and a metal silicide film 284b. This configuration is advantageous because the polysilicon film 284a offers excellent gap fill characteristics and the metal silicide film 284b has a small resistance. In particular, the excellent gap fill characteristics facilitate fabrication of the FET, as will be described below. Thus, when the conductive pattern 284 for the gate electrode includes the polysilicon film 284a and the metal silicide film 284b, the conductive pattern 284 can be more easily fabricated and an operating speed of the FET can be increased.

As described above, although the FETs according to the previous and present embodiments each include the active pattern of FIG. 1A, in which wire channels are arrayed in two rows and two columns, the present invention is not limited to the two×two wire channel arrangement. In particular, the active patterns shown in FIGS. 1B and 1C may also be applied to the FETs according to the previous and present embodiments.

As described above, an FET according to the present invention includes a plurality of wire channels arrayed apart from one another between source/drain regions. An FET according to an embodiment of the present invention may be a GAA FET, in which a gate electrode surrounds the entire exterior of wire channels, or an FET including a complete depletion type channel in which all wire channels are inverted. An FET according to another embodiment of the present invention may be an FET including an isotropic channel in which wire channels have circular or rectangular cross-sections as opposed to conventional plate-shaped cross-sectional shapes.

Method of Fabricating a Field Effect Transistor (FET)

Figure 12A:
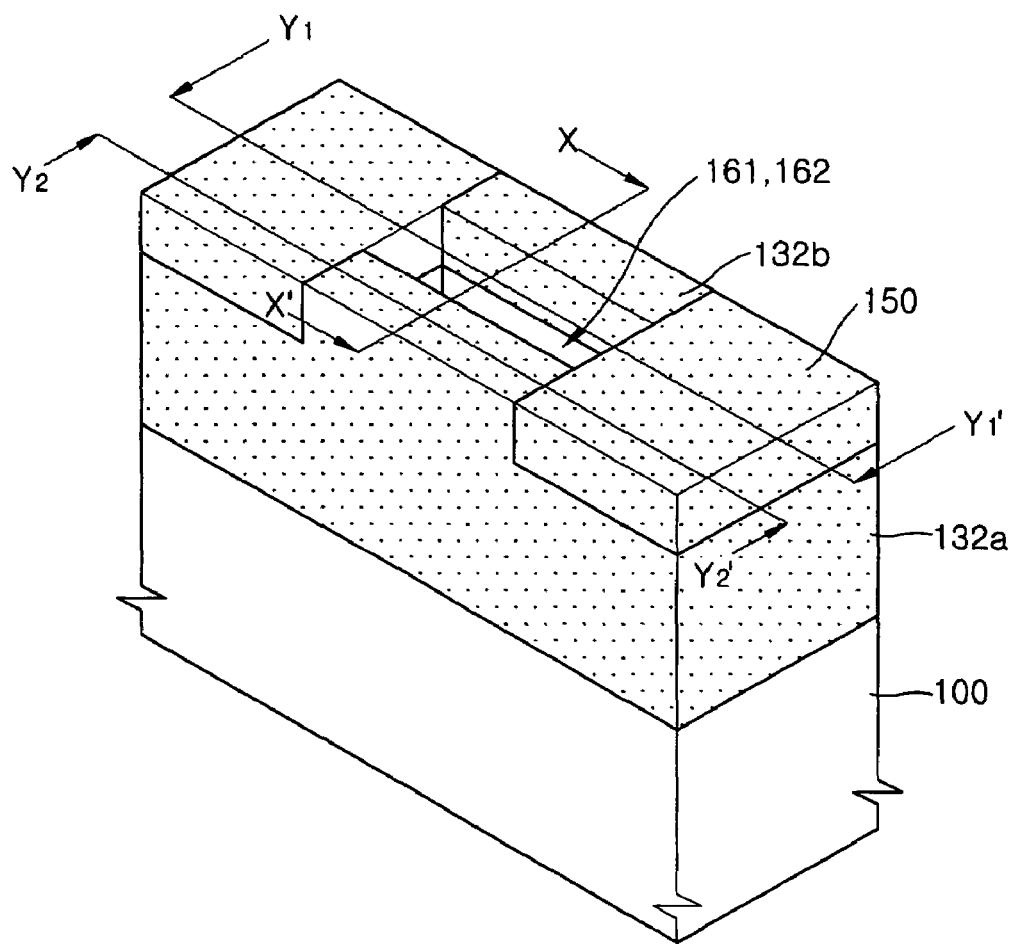
Figure 12B:
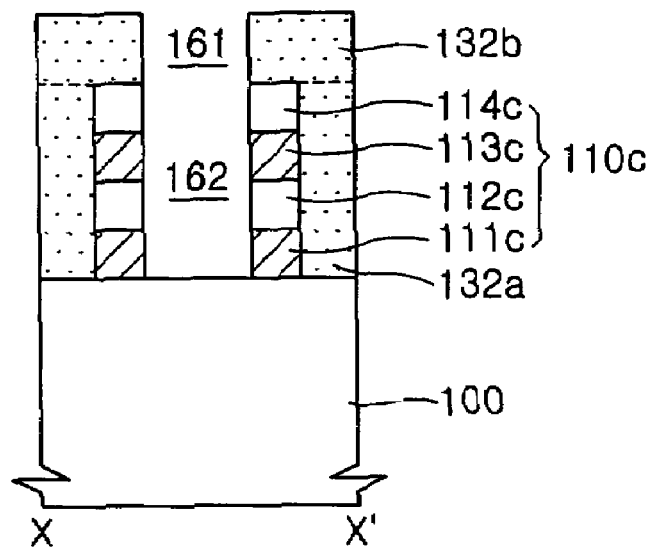
Figure 12C:
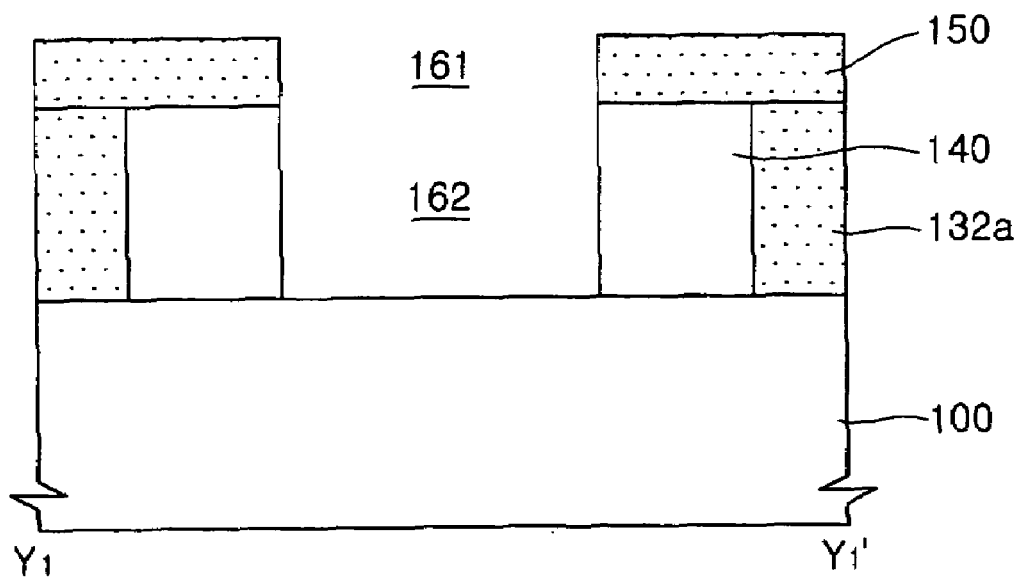
Figure 12D:
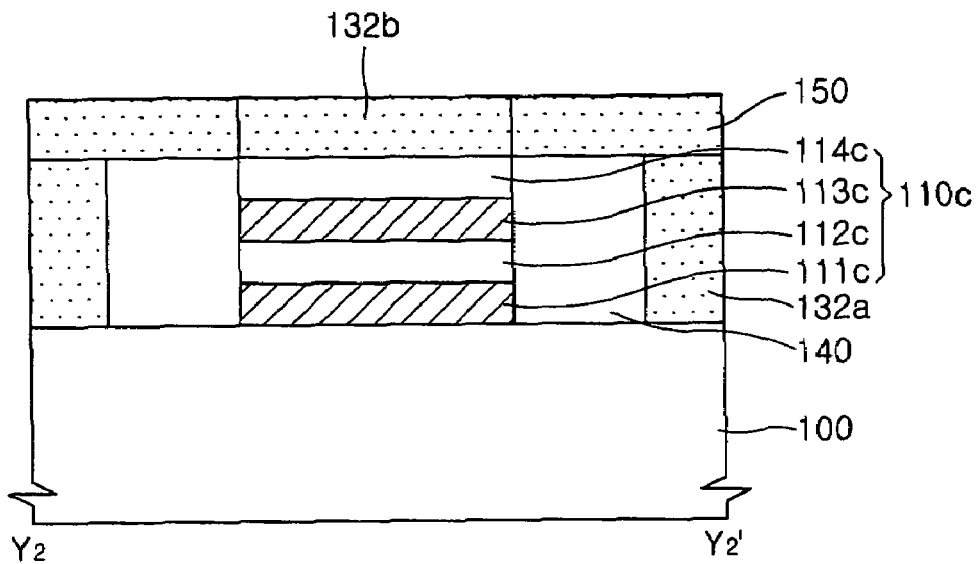
Figure 13A:
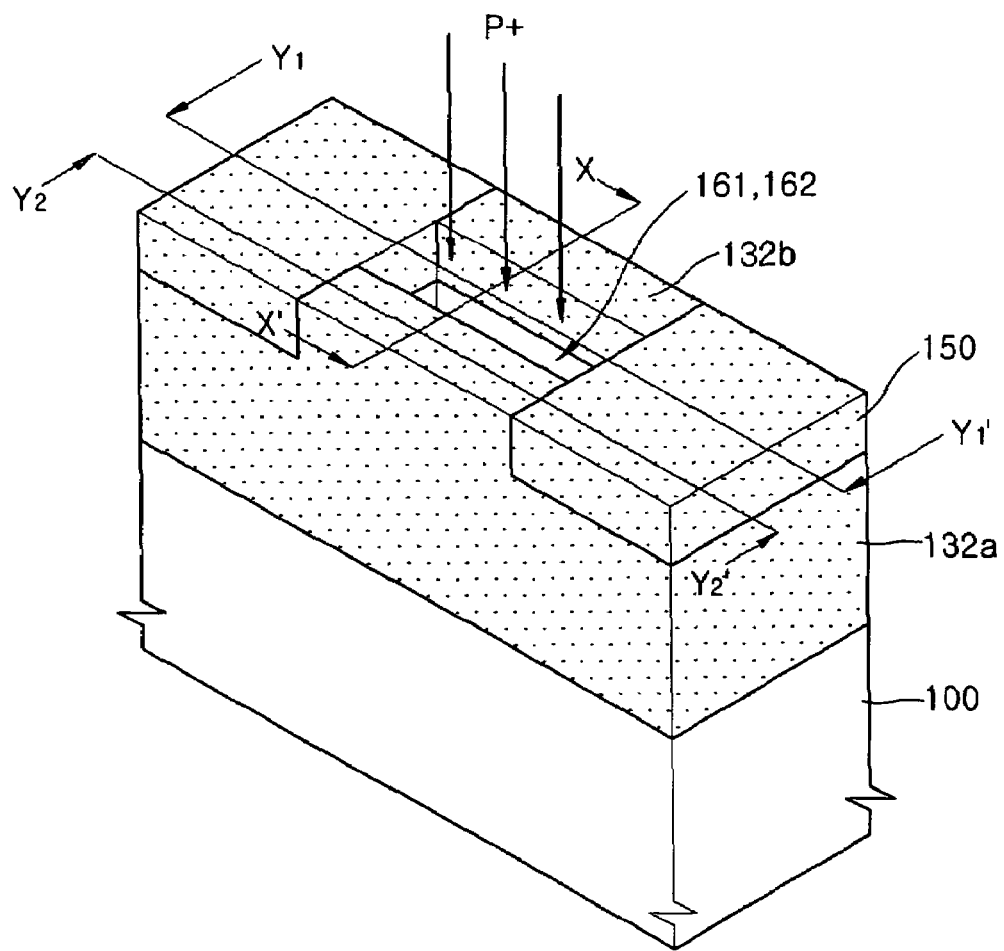

A method of fabricating a field effect transistor (FET) according to an embodiment of the present invention will now be described with reference to FIGS. 5A through 17D. Specifically, FIGS. 5A through 17D illustrate stages in a method of fabricating an FET according to an exemplary embodiment of the present invention, FIGS. 5A, 6A, . . . , and 17A illustrate schematic perspective views of the FET, FIGS. 5B, 6B, . . . , and 17B illustrate cross-sections taken along line X-X' of FIGS. 5A, 6A, . . . , and 17A, respectively, FIGS. 5C, 6C, . . . , 13C, and 17C illustrate cross-sections taken along line $Y_1$-$Y_1$' of FIGS. 5A, 6A, . . . , and 17A, respectively, and FIGS. 12D, 13D, 14C, 15C, 16C and 17D illustrate cross-sections taken along line $Y_2$-$Y_2$' of FIGS. 12A, 13A, . . . , and 17A, respectively.

Figure 5A:
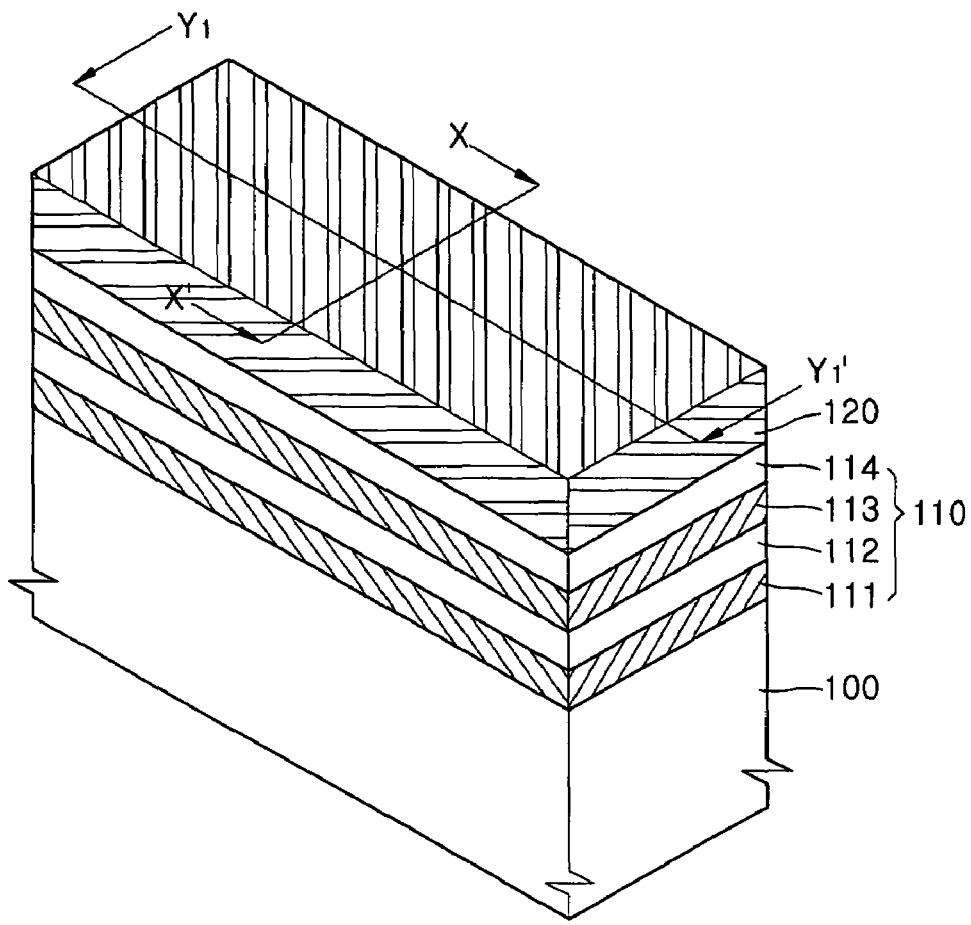
Figure 5B:
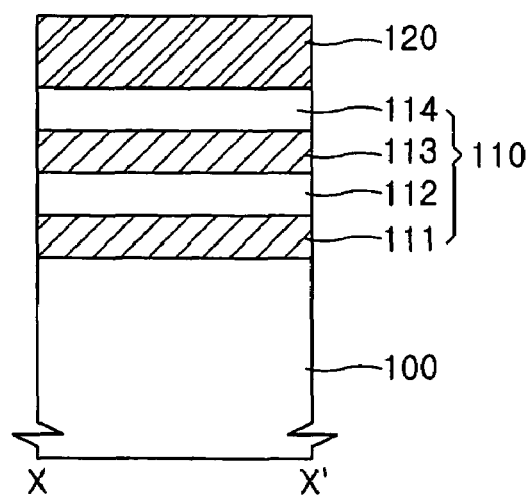
Figure 5C:
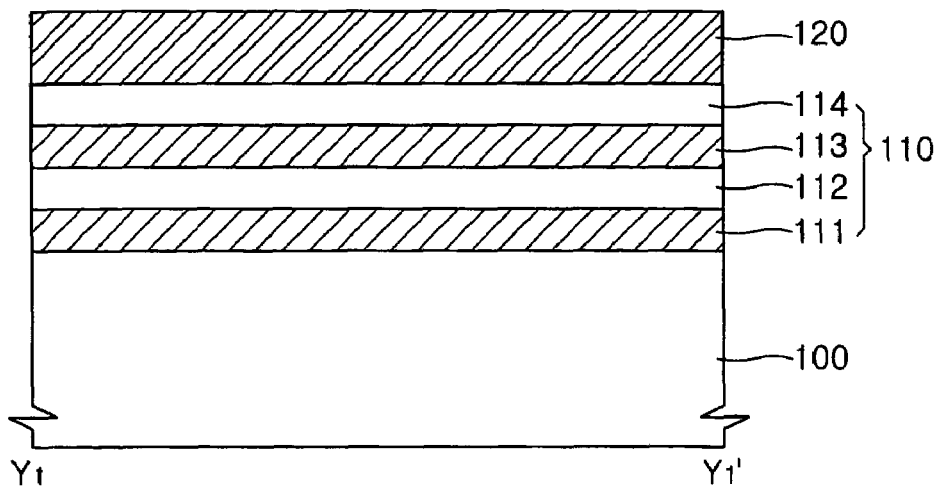

Referring to FIGS. 5A-5C, a channel forming preparation layer 110 is formed on the semiconductor substrate 100. The semiconductor substrate 100 may be, e.g., a monocrystalline Si substrate or a silicon-on-insulator (SOI) substrate. The semiconductor substrate 100 may include an isolation region (not shown). The isolation region may be formed using a conventional fabrication process, e.g., a shallow trench isolation (STI) process. A channel forming preparation layer 110 is then formed on the semiconductor substrate 100.

In the present embodiment, an FET having wire channels exemplarily arrayed in two rows×two columns will be formed. To fabricate an FET having such a wire channel configuration, the channel forming preparation layer 110 includes a first sacrificial layer 111, a first channel layer 112, a second sacrificial layer 113, and a second channel layer 114 sequentially stacked on the semiconductor substrate 100. In an alternative embodiment, which will be described in connection with FIGS. 18A-21C, the channel forming preparation layer 110 may additionally include a third sacrificial layer (not shown in connection with the present embodiment) on the second channel layer 114. When the channel forming preparation layer 110 has a channel layer as the uppermost layer, as shown in FIGS. 5A-5C, an FET in which upper surfaces of the uppermost wire channels are equal to upper surfaces of source/drain patterns is fabricated, as illustrated in FIG. 1C. Alternatively, when the channel forming preparation layer 110 has a sacrificial layer as the uppermost layer, an FET in which upper surfaces of the uppermost wire channels are lower than upper surfaces of the source/drain patterns is fabricated, as illustrated, e.g., in FIGS. 1A and 1B.

As further alternatives to the present embodiment, to fabricate an FET in which wire channels are arrayed in one row×two columns, as shown in FIG. 1B, the channel forming preparation layer 110 includes only the first sacrificial layer 111 and the first channel layer 112. In this alternative arrangement, a second sacrificial layer 113 may be additionally formed on the first channel layer 112. To fabricate an FET in which wire channels are arrayed in three rows×two columns, as shown in FIG. 1C, the channel forming preparation layer 110 includes the first sacrificial layer 111, the first channel layer 112, the second sacrificial layer 113, the second channel layer 114, the third sacrificial layer (215 of FIG. 18A), and an additional third channel layer (not shown). In this alternative arrangement, a fourth sacrificial layer (not shown) may be additionally formed on the third channel layer. As may be seen from the above alternative arrangements of the channel forming preparation layer 110, various arrangements of the wire channels are possible in the context of the present invention.

The first and second sacrificial layers 111 and 113 and the first and second channel layers 112 and 114 may be formed using an epitaxial growth method to control the thickness of each layer. As necessary, the first and second sacrificial layers 111 and 113 may be planarized using a hydrogen annealing. The first and second sacrificial layers 111 and 113 are preferably formed to have etch selectivities with respect to the first and second channel layers 112 and 114. In addition, the first and second sacrificial layers 111 and 113 preferably have similar lattice constants to those of the first and second channel layers 112 and 114.

The first and second channel layers 112 and 114 may be formed of epitaxial Si, e.g., monocrystalline Si. When the first and second channel layers 112 and 114 are formed of epitaxial Si, the first and second sacrificial layers 111 and 113 may be formed of epitaxial silicon germanium (SiGe). In the context of the present invention, the channel layers 112 and 114 are formed of epitaxial Si and the sacrificial layers 111 and 113 are formed of epitaxial SiGe. In this case, the first and second sacrificial layers 111 and 113 and the first and second channel layers 112 and 114 are preferably formed in sequence in situ.

The first and second epitaxial SiGe layers 111 and 113 may be formed using a molecular beam epitaxy method. To grow the first and second epitaxial SiGe layers 111 and 113, an $SiH_4$, $SiH_2Cl_2$, $SiCl_4$, or $Si_2H_6$ gas may be used as an Si source gas, and a $GeH_4$ gas may be used as a germanium source gas. The first and second epitaxial SiGe layers may have a germanium concentration between about 10 to 30%. The first epitaxial SiGe layer 111 may be formed to a predetermined thickness in consideration of a desired interval between the lowermost wire channels (112e of FIG. 3A) and the semiconductor substrate 100. The second epitaxial SiGe layer 113 may be formed to a predetermined thickness in consideration of a desired interval between the wire channels (112e and 114e of FIG. 3A). For example, the first and second epitaxial SiGe layers 111 and 113 may each have a thickness of about 10 to 40 nm. The thickness of each of the first and second epitaxial SiGe layers 111 and 113, however, is not limited to these exemplary values.

More specifically, the first and second epitaxial SiGe layers may be epitaxially grown to a thickness of less than about 30 nm. Although the first and second epitaxial SiGe layers may be grown thicker than 30 nm by reducing a Ge concentration in the layer, e.g., at $Si_{0.8}Ge_{0.2}$, a layer may be formed to a thickness of about 50 nm, it is difficult to selectively etch a layer having such a large thickness. Moreover, a layer formed having a thickness greater than a critical thickness, i.e., about 30 nm, may result in the formation of dislocations. Preferably, $Si_{0.7}Ge_{0.3}$ is used and the first and second epitaxial SiGe layers are formed to a thickness of less than about 30 nm, e.g., about 25 nm.

The first and second epitaxial Si layers 112 and 114 may be formed using a molecular beam epitaxy method. To grow the first and second epitaxial Si layers 112 and 114, an $SiH_4$, $SiH_2Cl_2$, $SiCl_4$, or $Si_2H_6$ gas may be used as an Si source gas. The first and second epitaxial Si layers 112 and 114 may be formed to predetermined thicknesses in consideration of sizes of cross-sections of the wire channels. If target heights of the cross-sections of the wire channels (112e and 114e of FIG. 3A) are in a range of between about 10 to 30 nm, the first and second epitaxial Si layers 112 and 114 may preferably be formed to have thicknesses of about 15 to 40 nm, that is, thicknesses slightly greater than the target heights. The reason why the first and second epitaxial Si layers 112 and 114 are formed to have thicknesses slightly greater than the target heights will be described later. The thickness of each of the first and second epitaxial Si layers 112 and 114, however, is not limited to these exemplary values.

A hard mask layer 120 is then formed on the channel forming preparation layer 110. In consideration of subsequent aspects of the method of fabricating the FET, the hard mask layer 120 is formed of a material having a high etch selectivity with respect to the material forming the channel layers, e.g., Si, and the material forming the sacrificial layers, e.g., SiGe. Accordingly, the hard mask layer 120 may be formed of silicon nitride (SiN). The hard mask layer 120 may have a thickness of about 100 nm or less, and may be formed using a conventional deposition method, e.g., a chemical vapor deposition (CVD) method, a sub-atmospheric CVD (SACVD) method, a low-pressure CVD (LPCVD) method, a plasma enhanced CVD (PECVD) method, or other similar method.

Prior to forming the hard mask layer 120, a buffer layer (not shown), e.g., a pad oxide film such as $SiO_2$, may be formed on the channel forming preparation layer 110 to be interposed between the channel forming preparation layer 110 and the hard mask layer 120. The buffer layer reduces a stress from the hard mask layer 120.

Figure 6A:
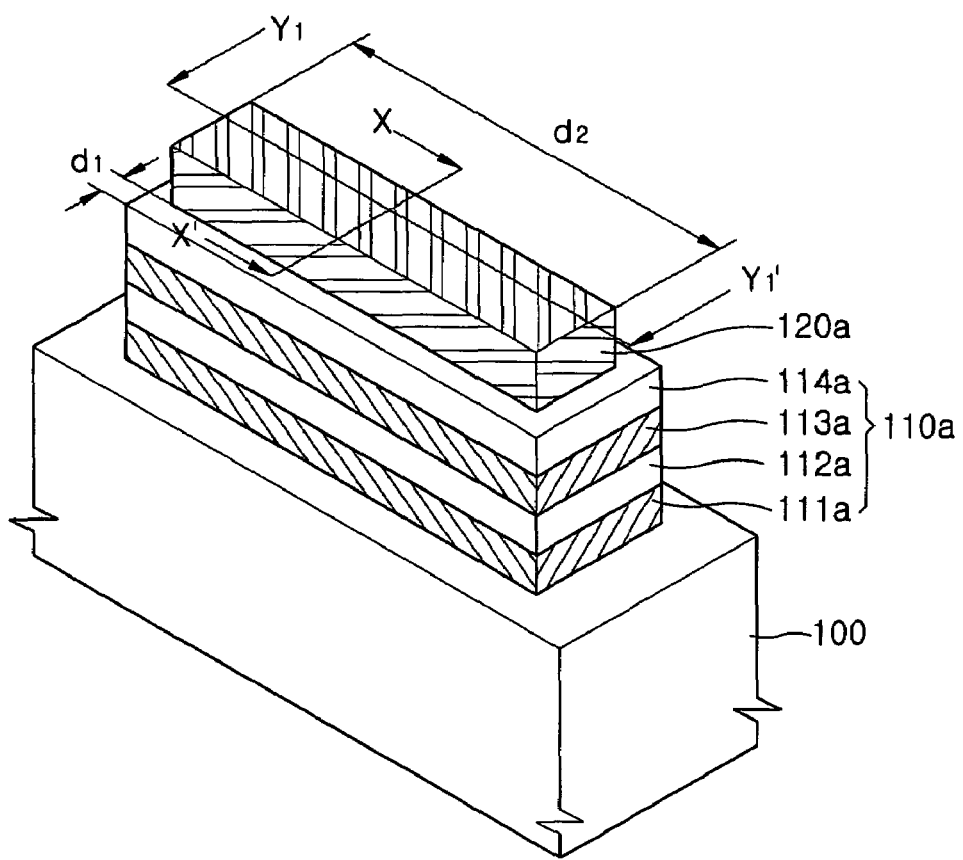
Figure 6B:
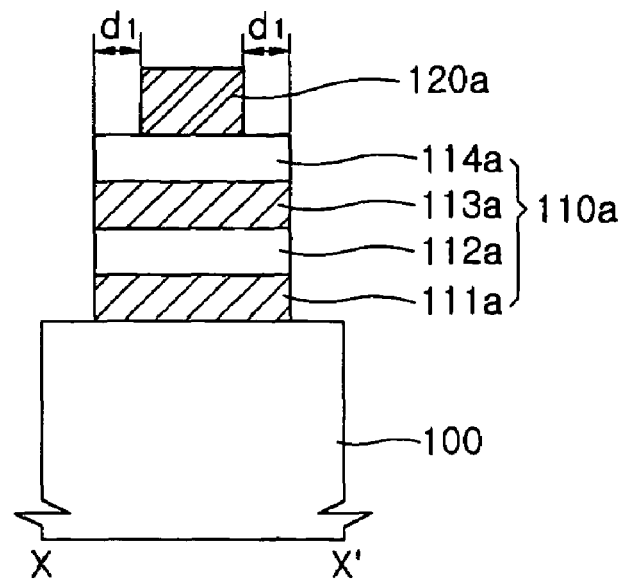
Figure 6C:
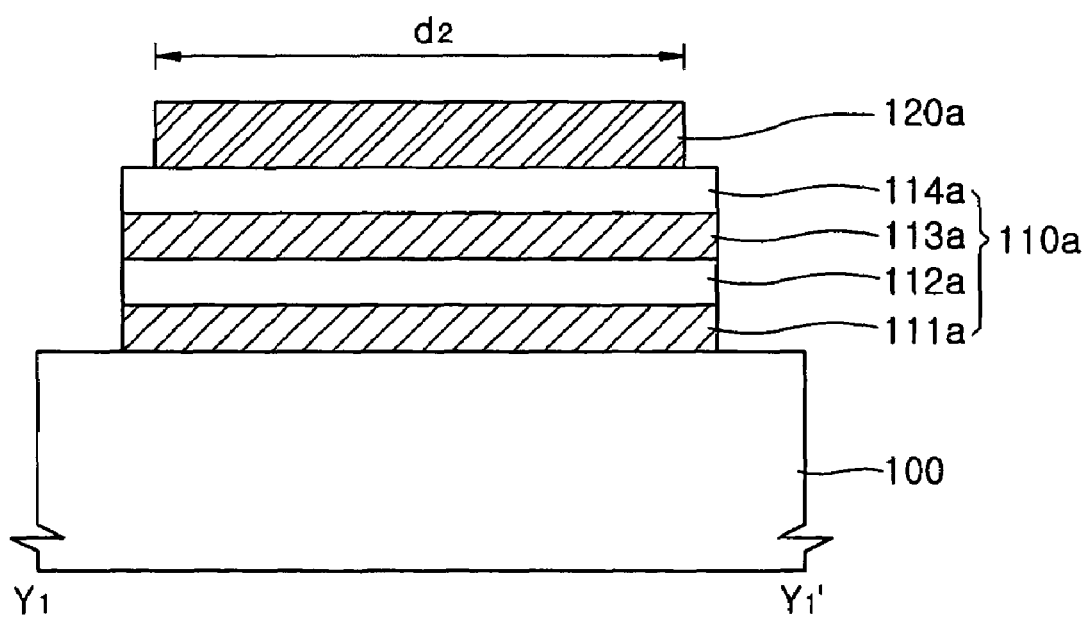

Referring to FIGS. 6A-6C, a channel forming preparation pattern 110a and a hard mask pattern 120a are formed by patterning the channel forming preparation layer 110 and the hard mask layer 120, respectively. The channel forming preparation pattern 110a includes a first SiGe pattern 111a, a first Si pattern 112a, a second SiGe pattern 113a, and a second Si pattern 114a. The channel forming preparation pattern 110a has a size corresponding to an active region of the semiconductor substrate 100. For example, the channel forming preparation pattern 110a may be as large as each cell isolated from one another. The hard mask pattern 120a is smaller than the channel forming preparation pattern 110a. More specifically, the hard mask pattern 120a is at least a predetermined width $2d_1$ narrower than the channel-forming preparation pattern 110a in an X-X' direction as shown in FIG. 6A. The hard mask pattern 120a may also have a reduced length $d_2$ that is narrower than the channel forming preparation pattern 110a in an $Y_1$-$Y_1$' direction, as shown in FIG. 6C, but not necessarily. The width difference $d_1$ in the X-X' direction may preferably be equal to or similar to a thickness of each of the first epitaxial Si layers 112 and 114 in consideration of subsequent process steps, which will be described below.

Formation of the channel forming preparation pattern 110a and the hard mask pattern 120a may be accomplished in the following manner. The channel forming preparation layer 110 and the hard mask layer 120 are first patterned to a size of the channel forming preparation pattern 110a using a conventional photolithography process. For example, a photoresist pattern (not shown) or the patterned mask layer, i.e., the mask pattern 120a, may be used as an etch mask to etch the channel forming preparation layer 110. The hard mask layer 120 is then further etched by the width $d_1$ using an isotropic etching process. When the hard mask layer 120 is formed of SiN, the isotropic etching process may be performed using an etch solution including phosphoric acid ($H_3PO_4$). The isotropic etching process forms the hard mask pattern 120a, which is $2d_1$ smaller than the channel forming preparation pattern 110a in each of the X-X' and $Y_1$-$Y_1$' directions.

Figure 7A:
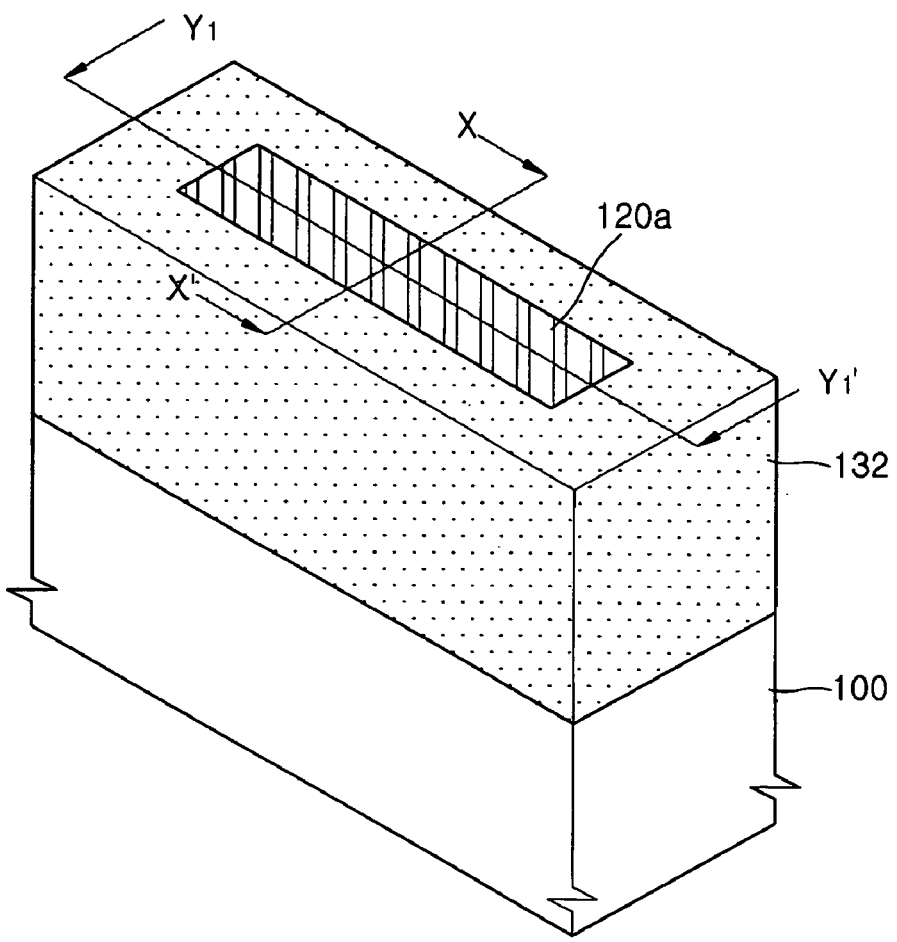
Figure 7B:
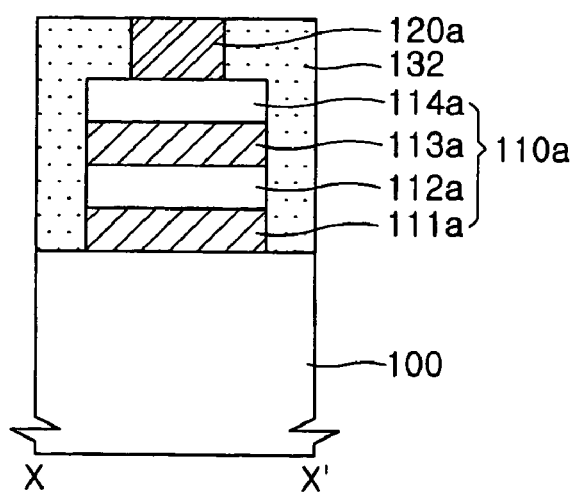
Figure 7C:
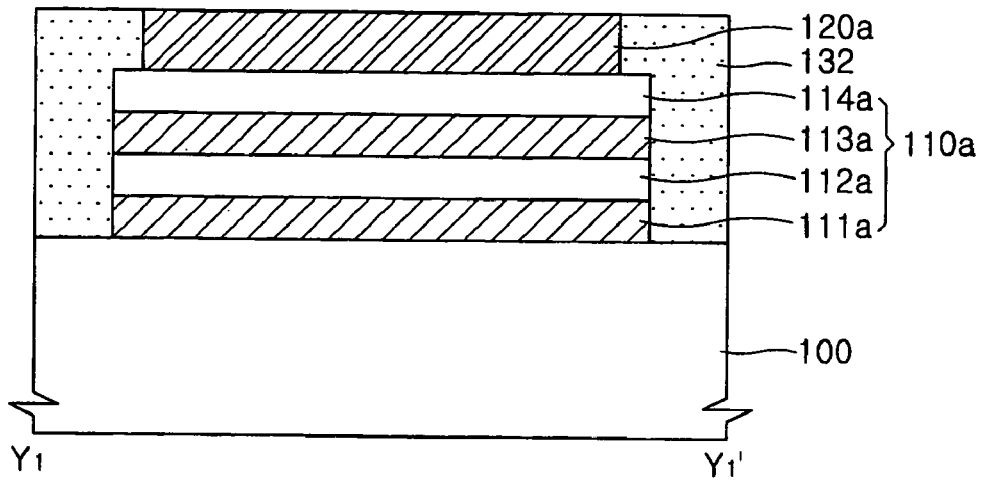

Referring to FIGS. 7A-7C, a first dielectric layer, e.g., a thick molding insulative layer, is deposited on the semiconductor substrate 100, the channel forming preparation pattern 110a, and the hard mask pattern 120a. The first dielectric layer is then planarized, e.g., by chemical mechanical polishing (CMP), until the hard mask pattern 120a is exposed. Resultantly, a molded pattern 132 surrounding the channel forming preparation pattern 110a and the hard mask pattern 120a is formed on the semiconductor substrate 100. The molded pattern 132 is preferably formed of a material having a high etch selectivity with respect to the first and second SiGe patterns 111a and 113a and the first and second Si patterns 112a and 114a. For example, when the hard mask pattern 120a is formed of SiN, the molded pattern 132 may be formed of $SiO_2$. In this case, the molded pattern 132 may be an $SiO_2$ film selected from among an undoped silicate glass (USG) film, a high-density plasma (HDP) oxide film, a plasma enhanced-tetraethyl ortho silicate (PE-TEOS) film, and a combination of the USG film, the HDP oxide film, and the PE-TEOS film.

Figure 8A:
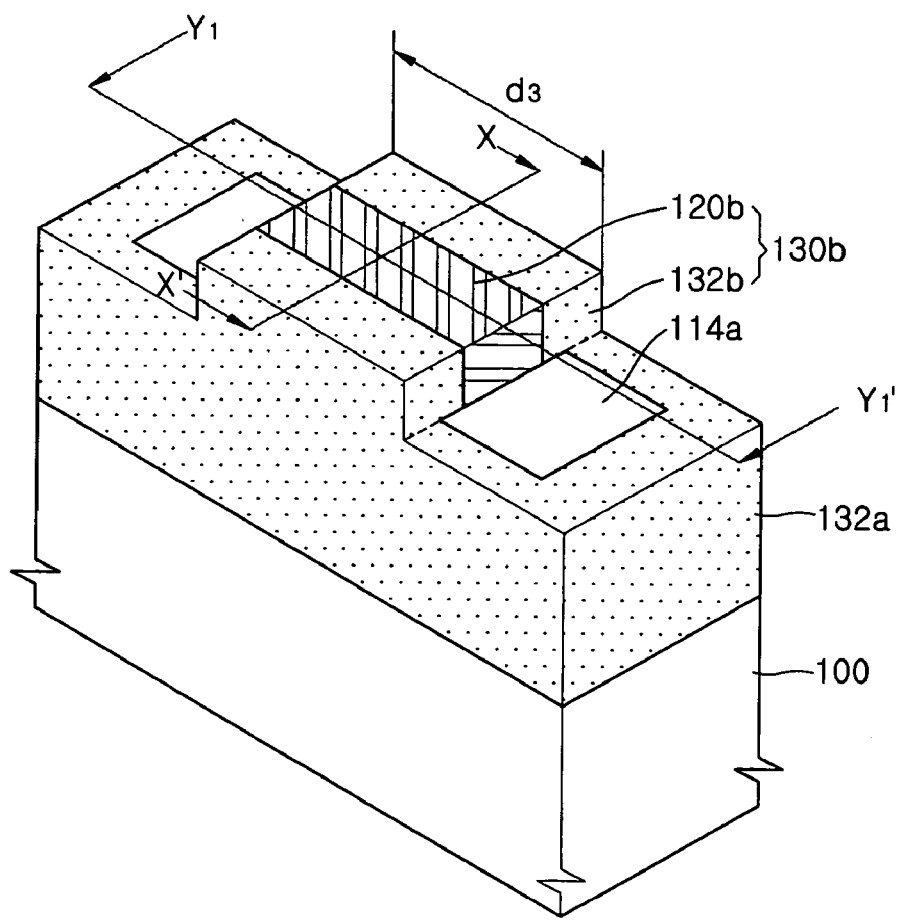
Figure 8B:
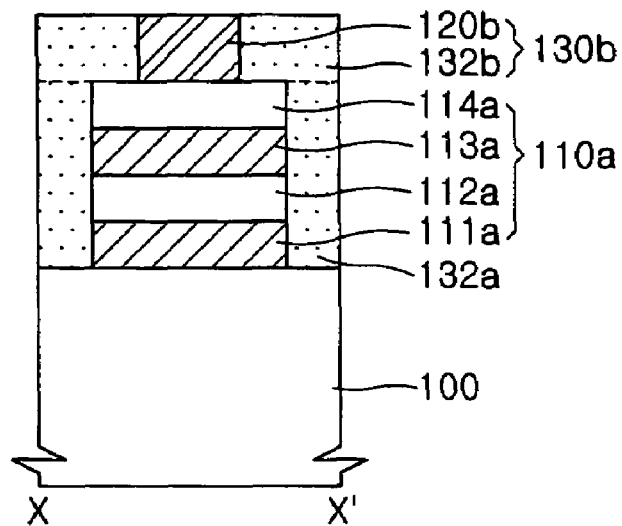
Figure 8C:
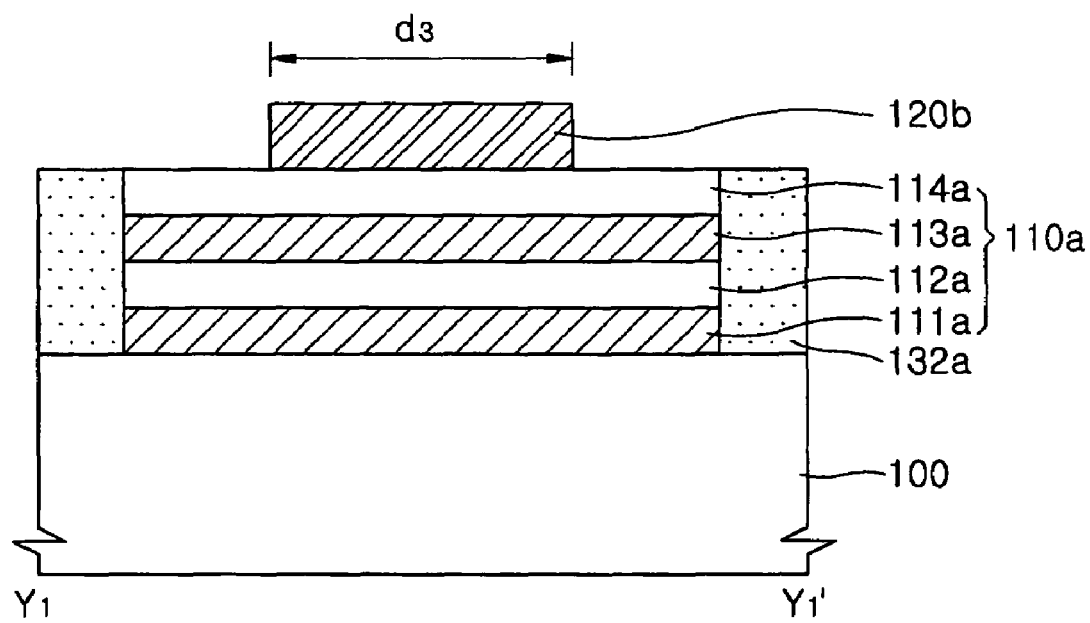

Referring to FIGS. 8A-8C, the molded pattern 132 and the hard mask pattern 120a are simultaneously patterned to form a dummy gate pattern 130b, which includes a portion 132b of the molded pattern 132 and a remaining portion 120b of the hard mask pattern 120a. Another portion 132a of the molded pattern 132a remains on the semiconductor substrate 100. During this patterning, a photoresist pattern may be used as an etch mask. The molded pattern 132 and the mask pattern 120a may be simultaneously etched using an etch gas that etches an SiN film and an $SiO_2$ film at identical rates. If, however, the hard mask layer 120 is patterned in the process of FIGS. 6A through 6C to form a hard mask pattern 120a having a width $d_3$ instead of $d_2$, the mask pattern 120a does not need to be further etched in the etching process of FIGS. 8A-8C.

The molded pattern 132 and the hard mask pattern 120a are etched until an upper surface of the channel forming preparation pattern 110a, e.g., the second Si pattern 114a, is exposed on both sides of the dummy gate pattern 130b. At this time, a portion of the buffer layer, if present, is removed to expose the channel forming preparation pattern 110a. The dummy gate pattern 130b, which is a result of the etching, may be a line type elongated in the X-X' direction and may have a predetermined size, i.e., $d_3$, which may be set in consideration of a design rule, a channel length of an FET, and the like.

Figure 9A:
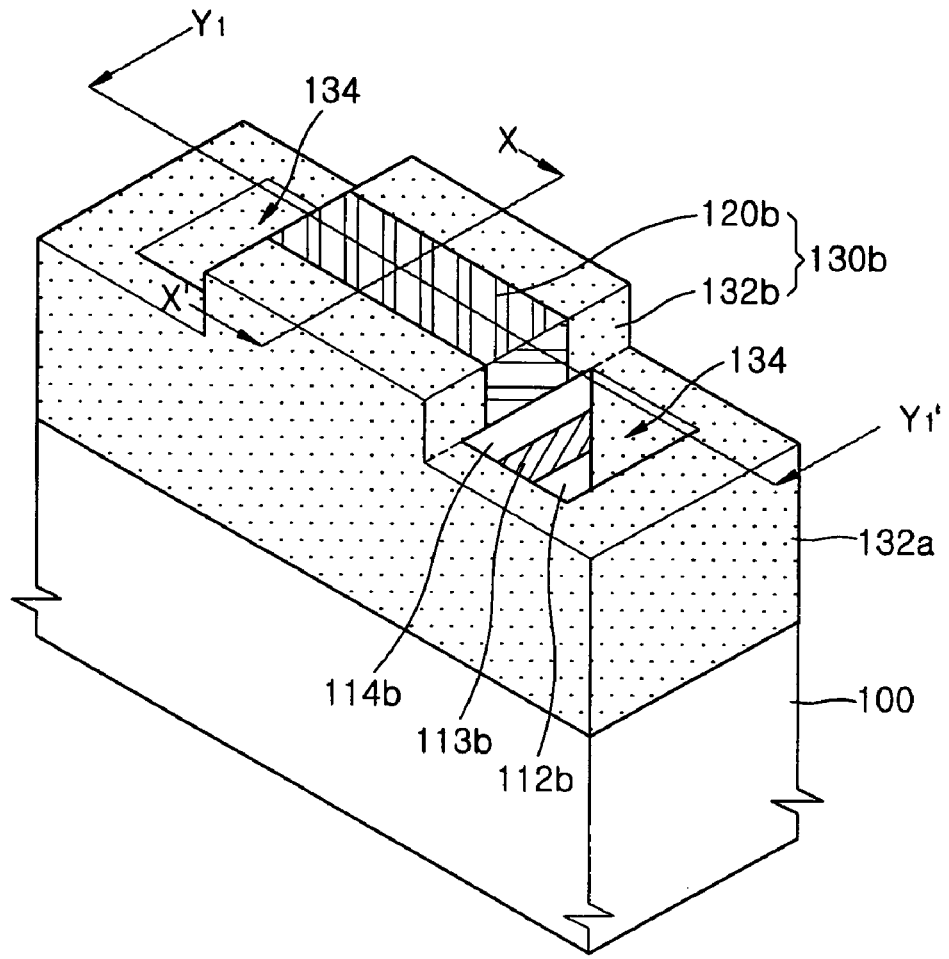
Figure 9B:
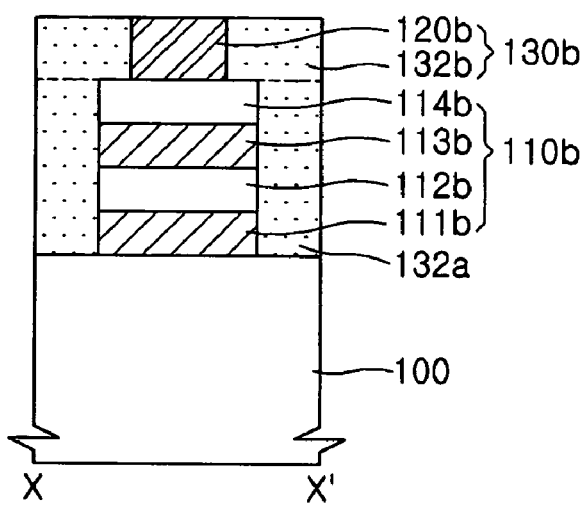
Figure 9C:
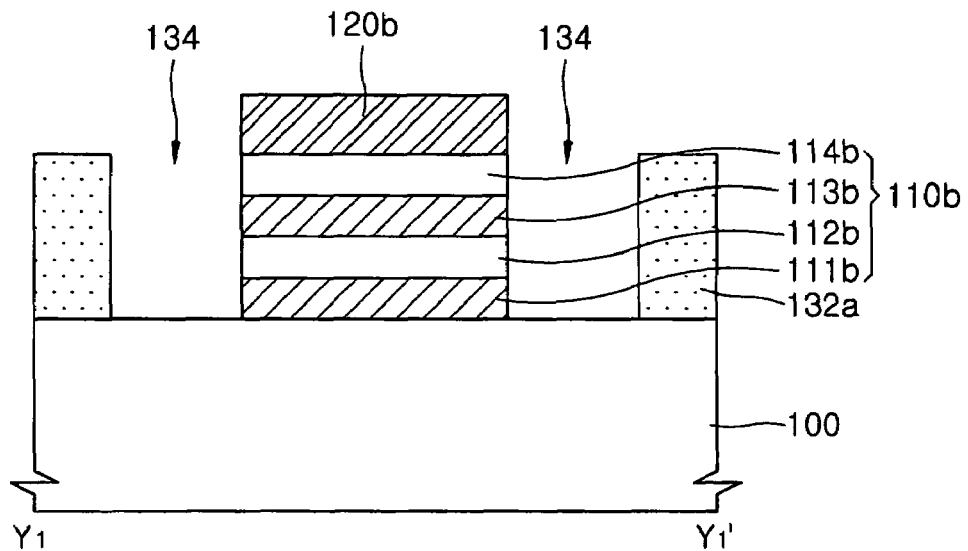

Referring to FIGS. 9A-9C, a portion of the channel forming preparation pattern 110a, which is exposed by the dummy gate pattern 130b, is anisotropically dry etched until the semiconductor substrate 100 is exposed. To perform this etching, an etch gas may be selected so that the dummy gate pattern 130b and the molded pattern 132a can be used as etch masks. For example, an etch gas providing high etch selectivities of Si and SiGe with respect to an $SiO_2$ film and an SiN film while providing an 1:1 etch selectivity of the Si with respect to the SiGe may be used. Preferably, the first and second Si patterns 112a and 114a and the first and second SiGe patterns 111a and 113a may be consecutively etched in situ. As a result, a remaining portion of the channel forming preparation pattern 110b under the dummy gate pattern 130b is unchanged, and a pair of first openings 134 defined by the remaining portion of the channel forming preparation pattern 110b and the molded pattern 132a is formed. The remaining portion of the channel forming preparation pattern 110b includes remaining portions of the first and second SiGe layers 111b and 113b and remaining portions of the first and second Si layers 112b and 114b. A portion of the upper surface of the semiconductor substrate 100 is exposed through the first openings 134. This etching may further remove an additional portion of the buffer layer, if present and not previously removed.

Figure 10A:
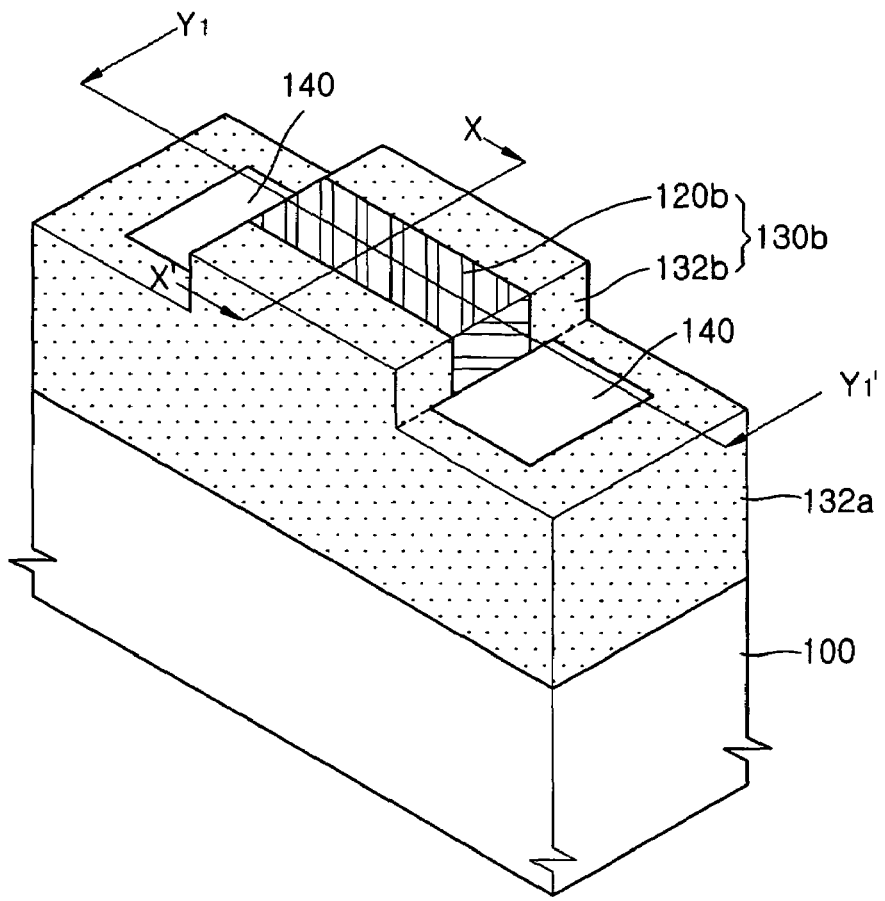
Figure 10B:
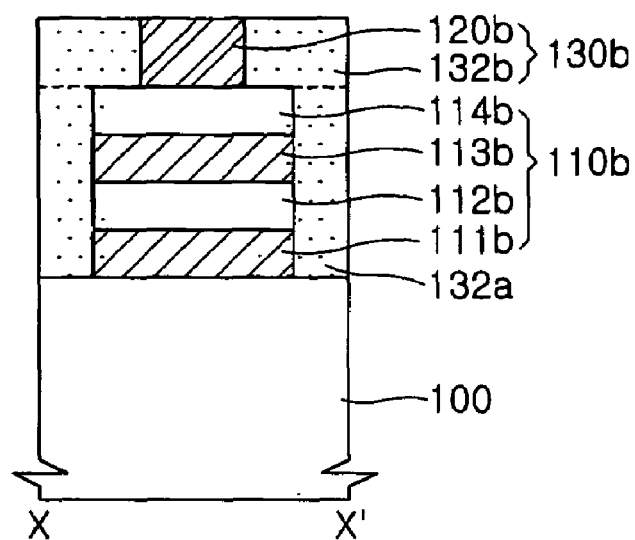
Figure 10C:
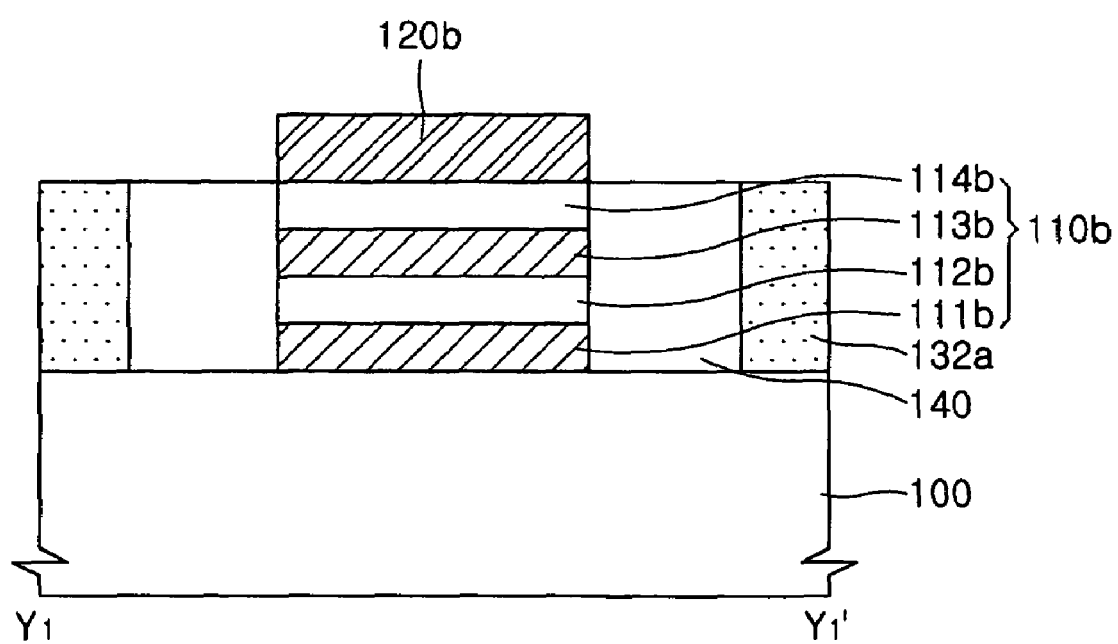

Referring to FIGS. 10A, 10B, and 10C, source/drain patterns 140 are formed in the first openings 134. The source/drain patterns 140 are formed of a material having a high etch selectivity in an etching solution that will be used to remove the remaining SiGe patterns (111c and 113c of FIG. 12A) later in the method. For example, the source/drain patterns 140 may be formed of monocrystalline Si or polysilicon. Alternatively, the source/drain patterns 140 may be formed of a material having a high etch selectivity in an SiGe etching solution, e.g. metal, metal silicide, or other suitable material.

The source/drain patterns 140 may be Si epitaxial layers. In this case, the first openings 134 may be filled with monocrystalline Si using a selective epitaxial growth (SEG) method to form the Si epitaxial layers only on portions of the semiconductor substrate 100 exposed through the first openings 134. Alternatively, the source/drain patterns 140 may be formed of polysilicon or metal by filling the first openings 134 with the selected material using a conventional deposition process. To fill the first openings 134, a deposited monocrystalline Si layer, a deposited polysilicon layer, or other similar layer is used. Although in the drawing figures it appears that an upper surface of the source/drain patterns 140 is substantially planar, the upper surface of the source/drain patterns 140 may not actually be smooth, e.g., the upper surface may include curves or waves. Subsequently, the deposited layer is planarized to the upper surface of the molded pattern 132a using an etchback process or other suitable process to form source/drain patterns 140 level with the remaining channel forming preparation pattern 110b.

In the alternative to planarizing the deposited layer, an optional annealing may be performed to smooth the upper surface of the source/drain patterns 140 that protrudes above an upper surface of the molded pattern 132a. This annealing may be performed in a hydrogen ($H_2$) environment at a temperature of between about 600 to 900° C. for between about several minutes and ten hours. This annealing may preferably be performed in an $H_2$ environment at a temperature of about 800° C. for about one hour.

Figure 11A:
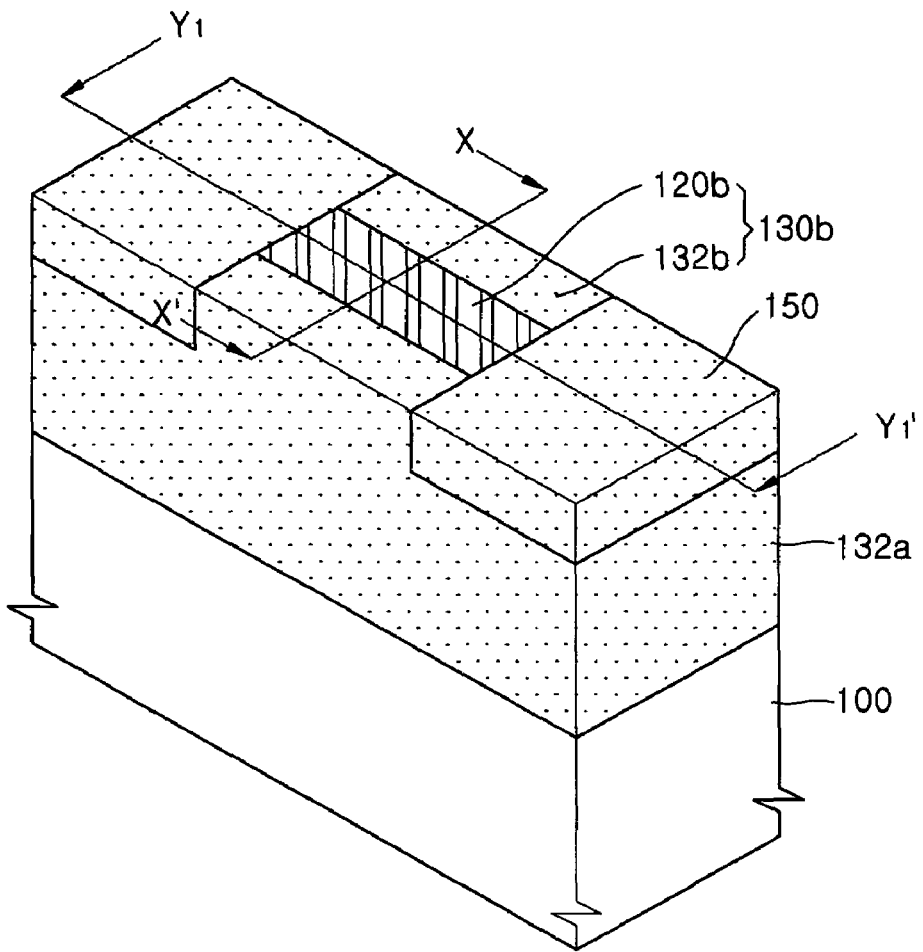
Figure 11B:
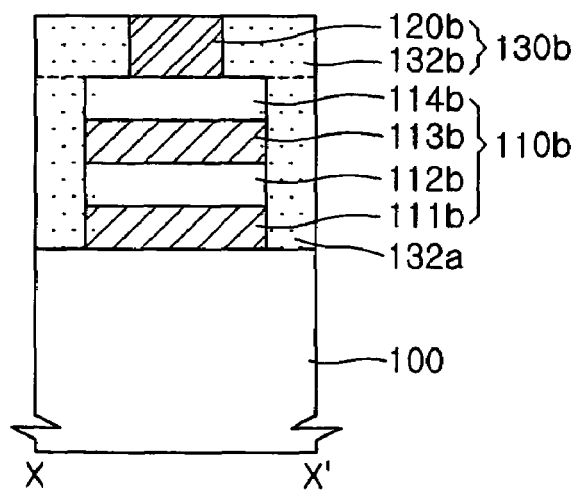
Figure 11C:
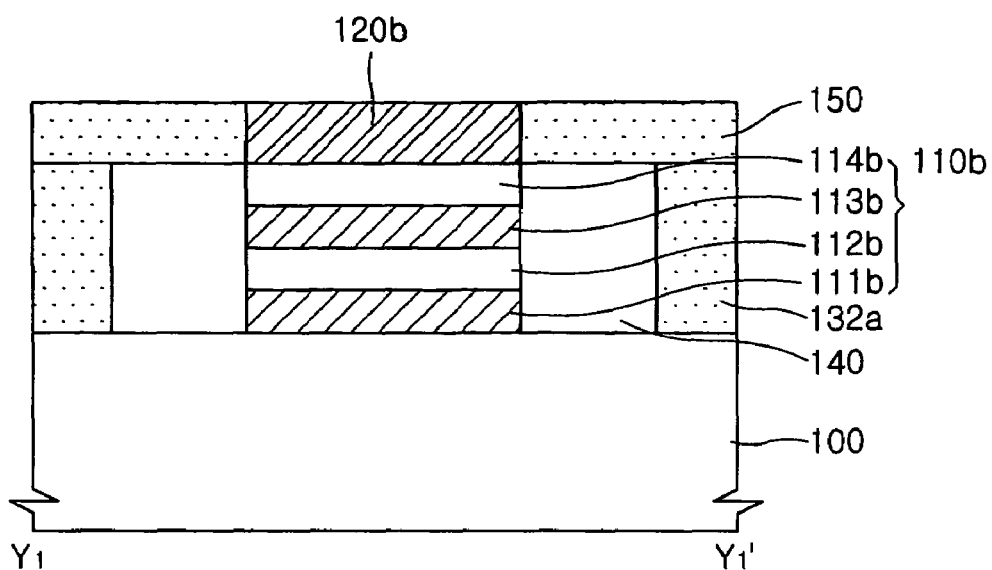

Referring to FIGS. 11A-11C, a second dielectric layer, i.e., an insulating layer for use as a buffer, is thickly deposited on the molded pattern 132a, the source/drain patterns 140, and the dummy gate pattern 130b. The second dielectric layer is then planarized, e.g., using CMP, until the dummy gate pattern 130b is exposed. Resultantly, a buffer layer pattern 150 surrounding the dummy gate pattern 130b is formed on the molded pattern 132a and the source/drain patterns 140. The buffer layer pattern 150 may preferably be formed of the same material as the material of the molded pattern 132. If the hard mask pattern 120a is formed of SiN, the buffer layer pattern 150 may be formed of SiN. The buffer layer pattern 150 may also be formed of a high-density plasma (HDP) oxide having excellent gap filling characteristics.

Referring to FIGS. 12A-12D, only the hard mask pattern 120b is removed from the dummy gate pattern 130b. If the hard mask layer 120 is formed of SiN, the hard mask pattern 120b may be removed using a phosphoric acid ($H_3PO_4$) stripping method based on an etching solution including $H_3PO_4$. As a result, a portion of an upper surface of the channel forming preparation pattern (110b of FIGS. 11B and 11C) is exposed, and a groove 161 defined by both the molded pattern 132b of the dummy gate pattern 130b and the buffer layer pattern 150 is formed within a space from which the hard mask pattern 120b was removed.

Subsequently, a portion of the channel forming preparation pattern 110b exposed through the groove 161 is anisotropically etched. To perform this etching, an etch gas may be selected so that the molded pattern 132b of the dummy gate pattern 130b and the buffer layer pattern 150 can be used as etch masks. For example, an etch gas providing high etch selectivities of Si and SiGe with respect to an $SiO_2$ film while providing an 1:1 etch selectivity of the Si with respect to the SiGe may be used. Preferably, the first and second Si patterns 112b and 114b and the first and second SiGe patterns 111b and 113b may be consecutively etched in situ. As a result, a remaining portion of the channel forming preparation pattern 110c only under the molded pattern 132b of the dummy gate pattern 130b is left unchanged, and a second opening 162 extending from the groove 161 is formed within a space defined by the remaining channel forming preparation pattern 110c and the source/drain patterns 140. The remaining portion of the channel forming preparation pattern 110c includes remaining portions of the first and second SiGe layers 111c and 113c and remaining portions of the first and second Si layers 112c and 114c. A portion of the upper surface of the semiconductor substrate 100 is exposed through the second opening 162.

Referring to FIGS. 13A-13D, an optional channel formation prevention layer 170 may be formed in the semiconductor substrate 100. As the channel formation prevention layer 170 is optional, the process illustrated in FIGS. 13A-13D is similarly optional.

At this stage in the fabrication of the FET, the channel formation prevention layer 170 may be formed by implanting ions P+ into the exposed portion of the semiconductor substrate 100, which is exposed through the groove 161 and the second opening 162. The molded pattern 132b of the dummy gate pattern 130b and the buffer layer pattern 150 may be used as implant masks.

In operation, the channel formation prevention layer 170 is used to prevent the base transistor from operating. Accordingly, ions implanted to form the channel formation prevention layer 170 may preferably be of the same conductive type as ions for the semiconductor substrate 100. For example, if the semiconductor substrate 100 is formed of a p+-type conductive material, a group 3B element, e.g., boron (B) or indium (In), may be implanted into the exposed portion of the semiconductor substrate 100.

Figure 13B:
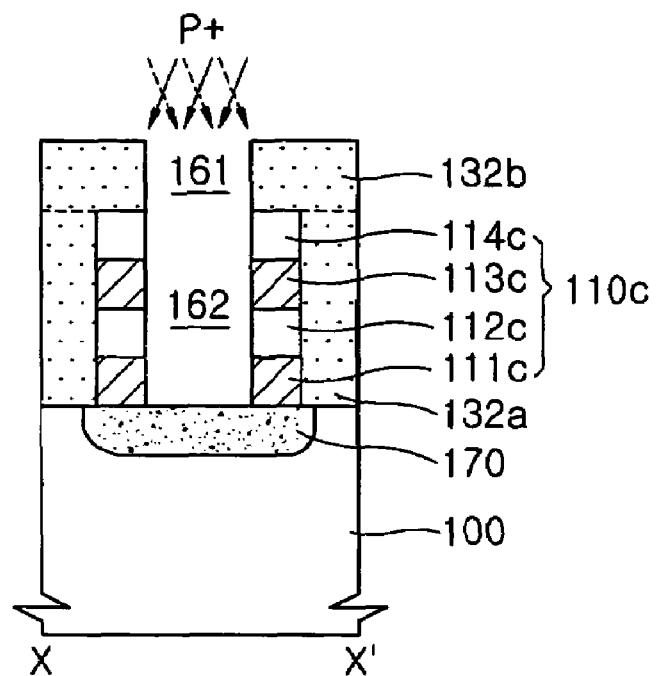
Figure 13C:
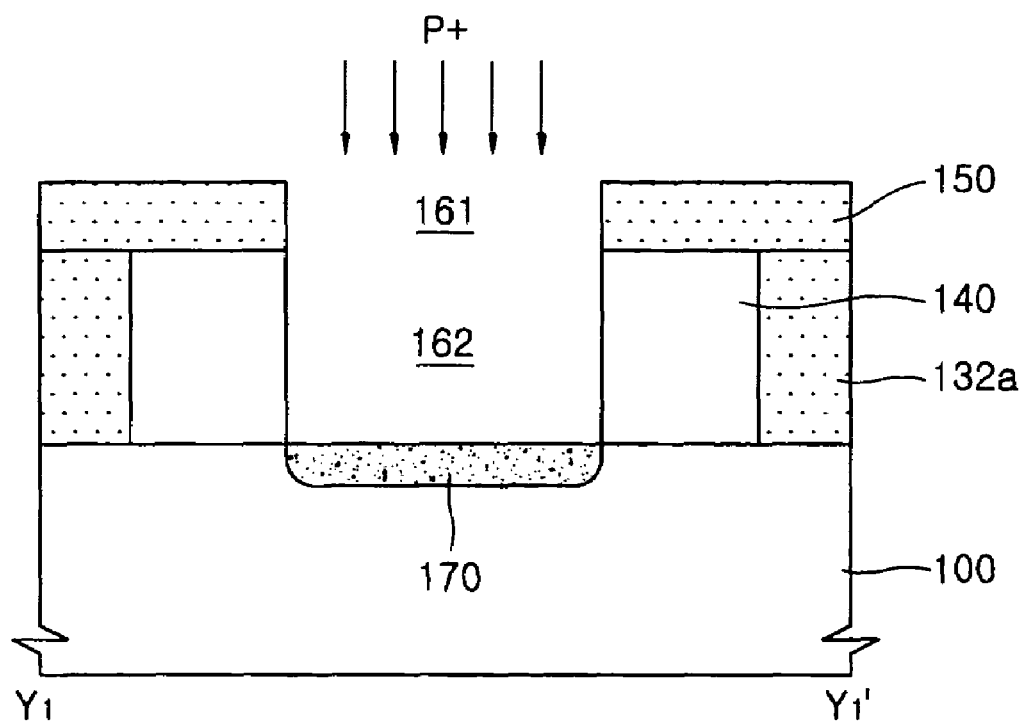
Figure 13D:
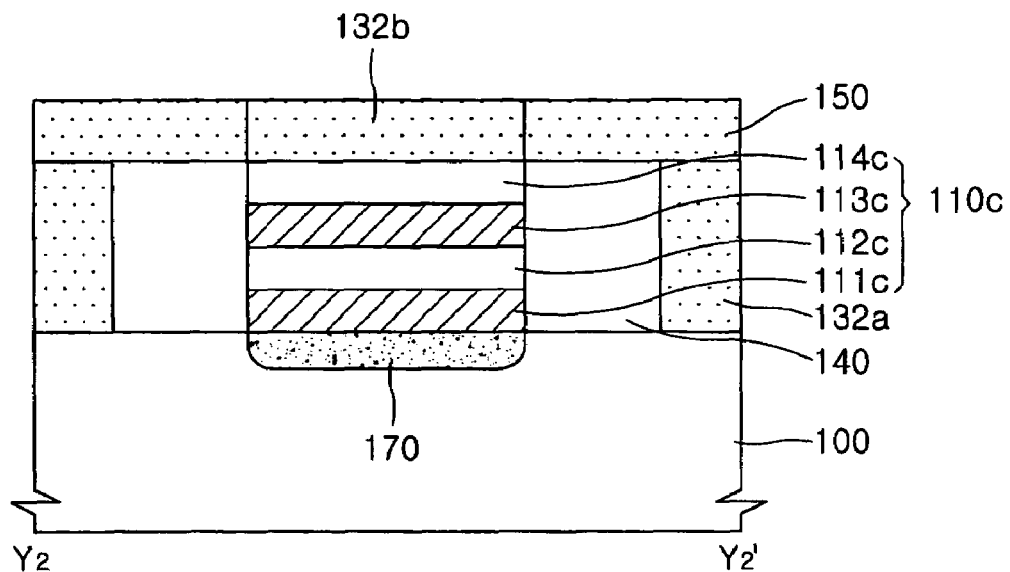

In addition to being formed on the exposed portion of the semiconductor substrate 100, the channel formation prevention layer 170 may preferably be additionally formed on a portion of the semiconductor substrate 100 under the channel forming preparation pattern 110c. To form the channel formation prevention layer 170 under the channel forming preparation pattern 110c, ions may be implanted at predetermined angles, as illustrated in FIG. 13B. Alternatively, an ion implanted region may be extended by a predetermined length in a side direction by appropriately controlling a temperature of a subsequent thermal treatment process.

Figure 14A:
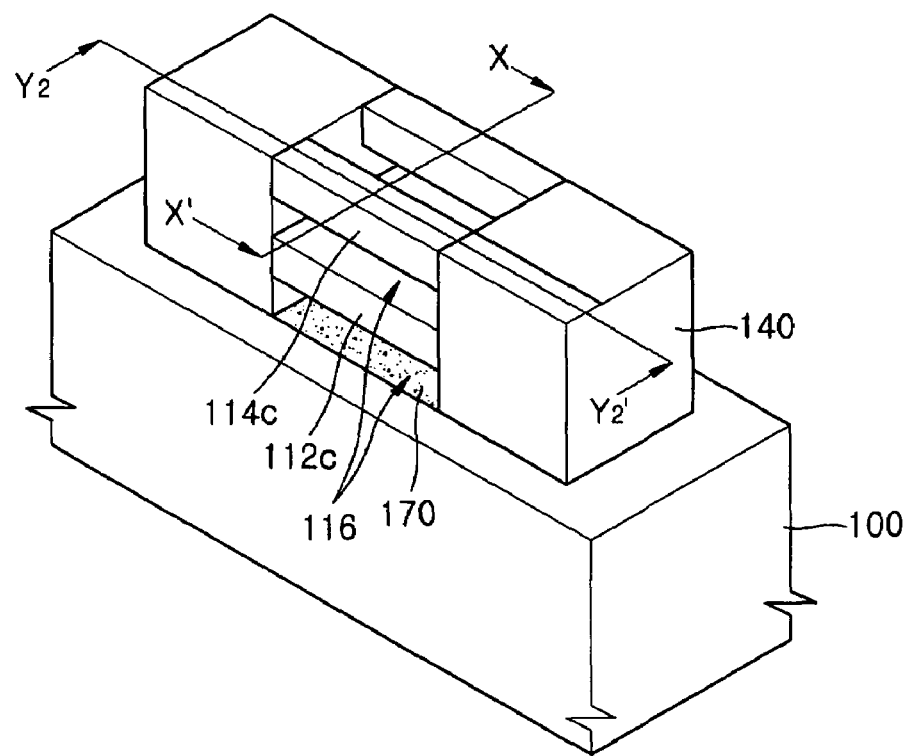
Figure 14B:
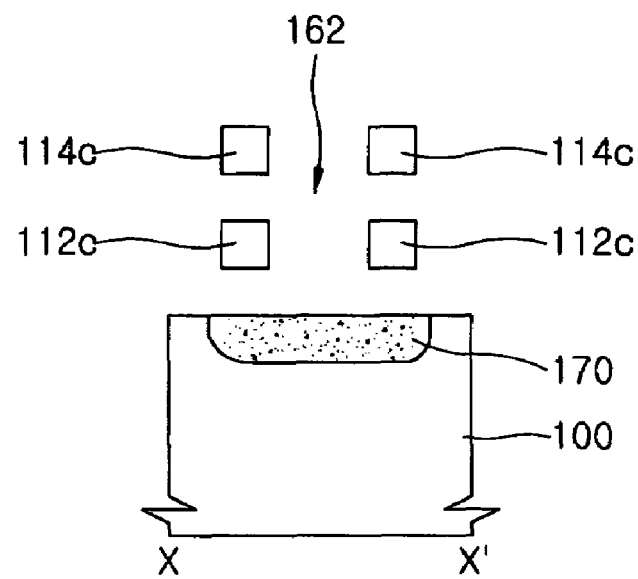
Figure 14C:
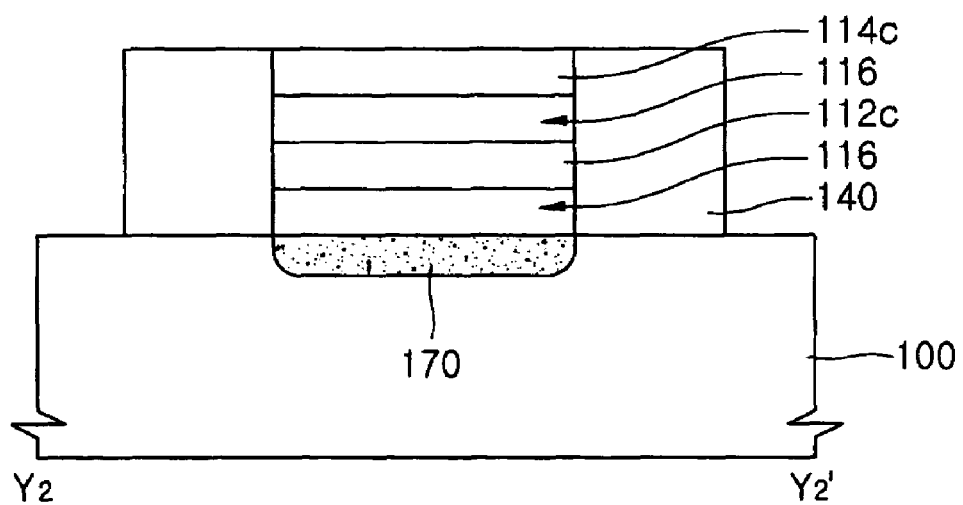

Referring to FIGS. 14A-14C, only the buffer layer pattern 150, i.e., the second dielectric layer, and the molded patterns 132a and 132b, i.e., the first dielectric layers, are selectively removed by etching. This etching may be performed using an etch gas or an etching solution that etches an $SiO_2$ film at a high etch selectivity with respect to Si and/or SiGe. Resultantly, an area of the semiconductor substrate 100, on which the channel forming preparation pattern 110a of FIG. 6A is not formed, is exposed.

The first and second sacrificial layer patterns 111c and 113c of the channel forming preparation pattern 110c are then removed. After the removal of the first and second sacrificial layer patterns 111c and 113c, windows 116 are formed between the channel layer patterns 112c and 114c and between the first channel layer 112c and the semiconductor substrate 100. The windows 116 expose the second opening 162. After formation of the windows 116, only a twoxtwo array of channel layer patterns 112c and 114c spaced apart from one another between the source/drain patterns 140 remains on the semiconductor substrate 100.

The channel layer patterns 112c and 114c remaining between the source/drain patterns 140 on the semiconductor substrate 100 have wire shapes. More specifically, after formation of the windows 116, the channel layer patterns 112c and 114c have substantially rectangular cross-sectional shapes. Further, heights of the cross-sections of the channel layer patterns 112c and 114c correspond to thicknesses of the channel layers 112 and 114 of FIG. 5A. Lengths of the cross-sections correspond to the width $d_1$ of FIG. 6A. Accordingly, to form an isotropic potential in a channel, the width $d_1$ of FIG. 6A is preferably almost the same as or similar to the thickness of each of the channel layer patterns 112 and 114 of FIG. 5A.

Removal of the first and second sacrificial layer patterns 111c and 113c may be accomplished by etching using a wet etching or a chemical dry etching. The etching is preferably performed so that each of the first and second sacrificial layer patterns 111c and 113c has an etch selectivity of at least about thirty (30) with respect to the semiconductor substrate 100 and the first and second channel layer patterns 112c and 114c. If the semiconductor substrate 100, the first and second channel layer patterns 112c and 114c, and the first and second sacrificial layer patterns 111c and 113c are formed of Si, epitaxial Si, and epitaxial SiGe, respectively, a mixture of hydrogen peroxide ($H_2O_2$), hydrogen fluoride (HF), and acetic acid ($CH_3COOH$), a mixture of ammonium hydroxide ($NH_4OH$), hydrogen peroxide ($H_2O_2$), and deionized water ($H_2O$), or an etching solution containing peracetic acid may be used as an etching solution to remove the first and second sacrificial layer patterns 111c and 113c.

It is more preferable to etch the first and second sacrificial layer patterns 111c and 113c using the wet etching method than using the chemical dry etching method. In addition, when a wet etching solution providing an etch rate of several hundreds of angstroms per minute is used, the time required for the etching can be decreased. The etching solution providing an etch rate of several hundreds of angstroms per minute may be a mixture solution including ammonium hydroxide ($NH_4OH$), hydrogen peroxide ($H_2O_2$), and deionized water ($H_2O$), as described in greater detail below. The mixture solution may further include peracetic acid, acetic acid, fluoric acid, and/or a surface active agent. For example, a standard cleaning solution SC-1, in which $NH_4OH$, $H_2O_2$, and $H_2O$ are mixed at 1:5:1 or 1:5:20 may be used. When this mixture solution is heated at 40 to 75° C. to be used, the SiGe layer is effectively removed.

In the etching of the first and second SiGe patterns, i.e., the first and second sacrificial layers, 111c and 113c using a mixture of ammonia, $H_2O_2$, and $H_2O$, a first operation is formation of a surface oxide film using $H_2O_2$. Since $H_2O_2$ has a strong oxidation force by being dissolved into $H_2O$ and 0, $H_2O_2$ oxidizes Si and Ge rapidly.

In a second operation, the ammonia is dissociated into $NH_4^+$ ions and $OH^-$ ions. The $OH^-$ ions peel an Si oxide and a Ge oxide of the first and second SiGe patterns 111c and 113c off the surfaces of the first and second SiGe patterns 111c and 113c. This second operation is called a lift-off using the $OH^-$ ions.

In a third operation, the Si and Ge oxides absorb the $OH^-$ ions to have an electrostatic repulsive power so as not to be re-attached to the SiGe patterns 111c and 113c. This is called termination by the $OH^-$ ions.

Since $H_2O_2$ is an acid solution, the pH of the mixture varies depending on a mixing ratio of the $H_2O_2$ to the ammonia. In other words, amounts of Si and Ge etched vary depending on the pH, so the $H_2O_2$ and the ammonia are mixed at a ratio providing an appropriate etch rate of Si and Ge while preventing Si pitting. Since a speed at which $NH_3$ vapor evaporates increases at a high temperature, e.g., 70° C., an additional supply of ammonia is needed.

In a first step, i.e., an oxidation process, of the above-described etching mechanism, Ge is oxidized faster than Si and consequently etched faster than Si. In an SiGe film including Ge and Si, Ge is rapidly etched, and a remaining Si—Ge film becomes unstable. Accordingly, Si is easily attacked by an etching solution. Thus, an etch rate of the SiGe sacrificial layer patterns 111c and 113c becomes higher than that of the channel layer patterns 112c and 114c, which are each comprised of a single material, e.g., Si.

The wire channels 112c and 114c, formed as described above, may have different sizes. More specifically, when the plurality of wire channels are arranged in at least two rows, as illustrated, e.g., in FIG. 14B, the wire channels in an upper row may have a different size, e.g., diameter or width, than the wire channels in a lower row. In particular, the wire channels 114c in the upper row may have a size that is either less than or greater than a size of the wire channels 112c in the lower row. Referring back to FIG. 1D, the upper wire channels 114c are shown having a size less than the lower wire channels 112c.

Figure 15A:
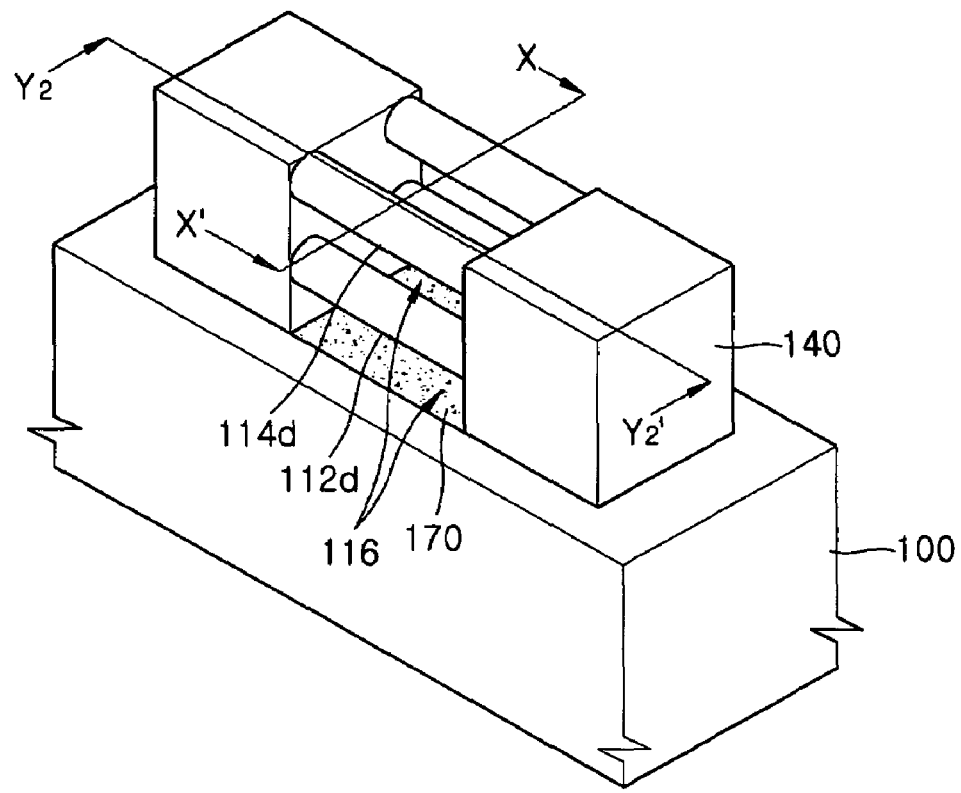
Figure 15B:
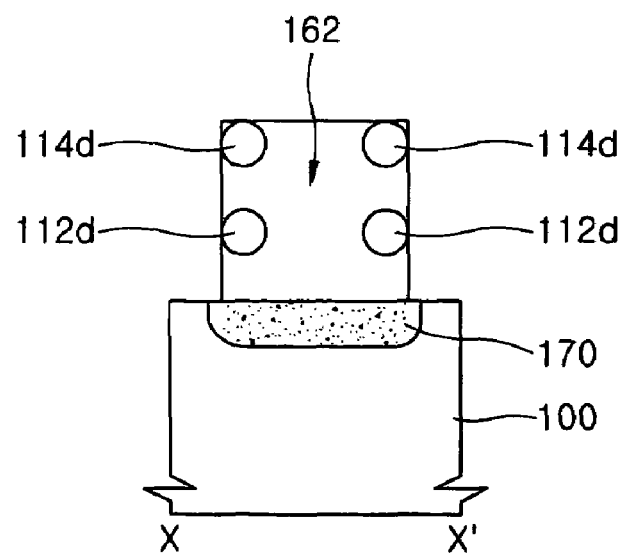
Figure 15C:
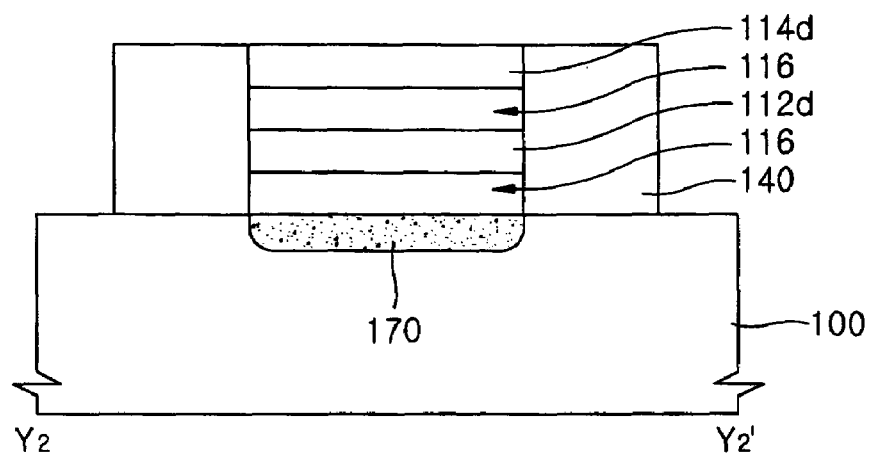

Referring to FIGS. 15A-15C, the semiconductor substrate 100 having the source/drain patterns 140 and the plurality of wire channels 112c and 114c formed thereon are primarily annealed. The primary annealing is optional and may be performed to form wire channels 112d and 114d having substantially circular cross-sectional shapes. As described above, when the wire channels 112d and 114d have substantially circular or oval cross-sectional shapes, as compared to substantially rectangular cross-sectional shapes, a more ideal isotropic potential can be formed in a channel. More specifically, substantially circular or oval wire channels are preferable to substantially square or rectangular wire channels because a round wire channel provides an improved electric field. In particular, a substantially round wire channel provides a uniform electric field in all directions, while a substantially square wire channel provide an electric field in only a single direction. Thus, it is preferable to perform the primary annealing process.

The primary annealing process may preferably be performed at a temperature sufficient to round the cross-sectional shapes of the wire channels 112d and 114d. For example, this annealing may be performed in a hydrogen ($H_2$) environment at a temperature of about 600 to 1200° C. for about several minutes to ten hours; this annealing may be performed in an argon (Ar) environment at a temperature of about 900 to 1200° C. for about several minutes to ten hours. By way of further alternative, this annealing may be performed by laser annealing for several seconds depending on an energy density. After this primary annealing process, the cross-sectional sizes of the wire channels 112d and 114d may decrease. However, this reduction in size is typically very small and is negligible.

Figure 16A:
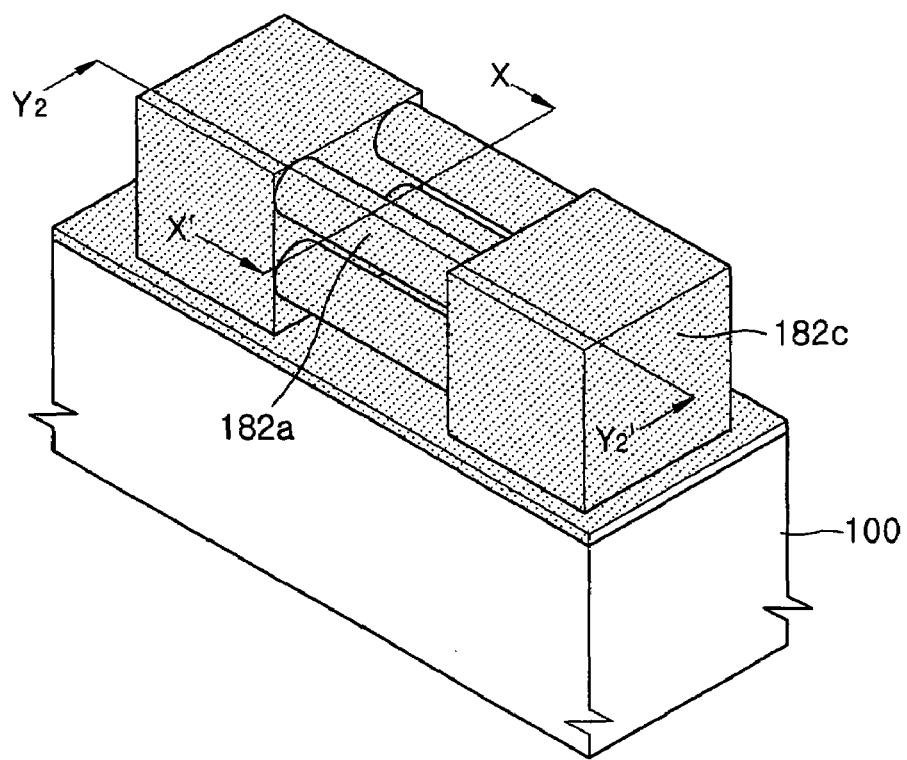
Figure 16B:
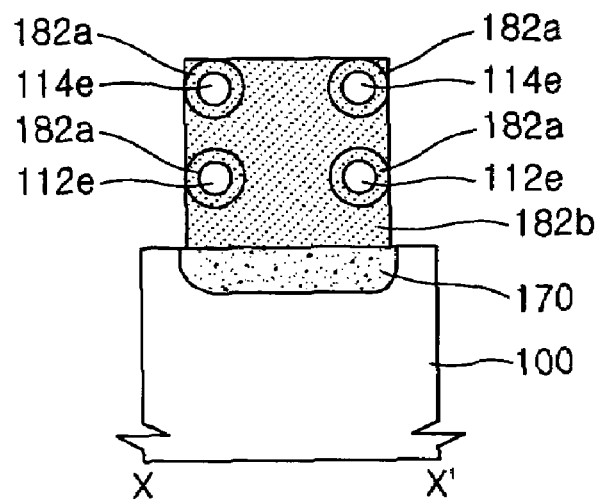
Figure 16C:
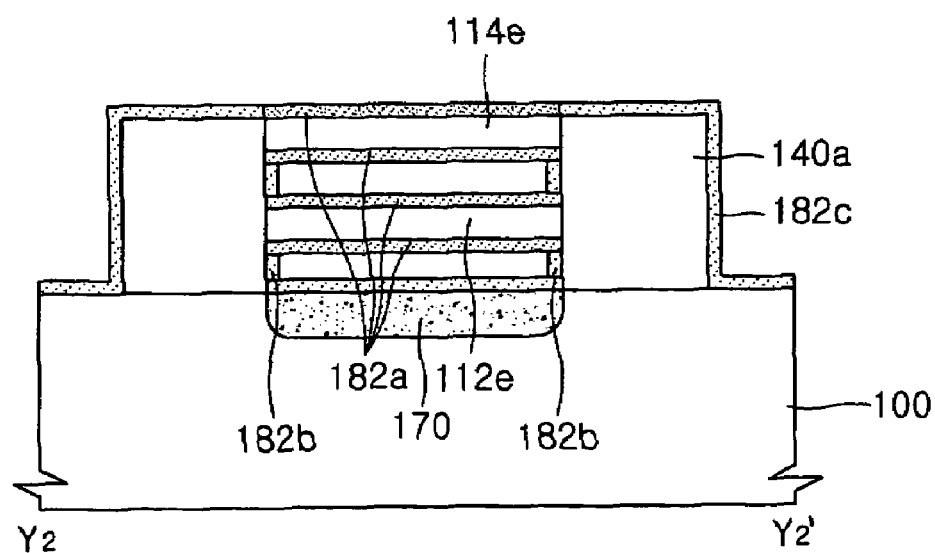

Referring to FIGS. 16A-16C, a secondary annealing is performed on a resultant structure after the primary annealing. The secondary annealing is performed under an oxygen or ozone atmosphere to form a gate dielectric layer 182a, i.e., a gate insulating film, to surround each of the wire channels 112d and 114d. When the secondary annealing is performed under an oxygen atmosphere or other similar condition, Si exposed on the resultant structure is consumed to form $SiO_2$ films 182a, 182b, and 182c on the resultant structure.

As a result of this secondary annealing, diameters of the wire channels 112d and 114d are reduced by a thickness of the consumed Si to form wire channels 112e and 114e. Accordingly, the thicknesses of the deposited channel layers 112 and 114 in the operation of FIG. 5A and the width d, in the operation of FIG. 6A are preferably set in consideration of the thickness of the consumed Si.

A temperature and duration of the secondary annealing process may vary depending on the thickness of the gate insulating film 182a to be formed. For example, the secondary annealing may be performed at a suitable temperature for a suitable period of time so that the gate insulating film 182a has a thickness of about 50 to 100 Å. After the secondary annealing, the $SiO_2$ films 182b and 182c may be incidentally formed on the semiconductor substrate 100 and the source/drain patterns 140a. The $SiO_2$ film 182b forms the short-circuit prevention insulating layer.

Referring to FIGS. 17A-17D, a conductive pattern 184 for use as a gate electrode is formed between the source/drain patterns 140a. The conductive pattern 184 for use as a gate electrode may be a single film formed of polysilicon or a composite film including polysilicon and a conductive material having a specific resistance smaller than that of the polysilicon. More specifically, at least a void between the source/drain patterns 140a, i.e., where the wire channels 112e and 114e have already been interposed, may preferably be filled with polysilicon. Because the void defined by the source/drain patterns 140a and the wire channels 112e and 114e arrayed between the source/drain patterns 140a, i.e., the second opening 162 and the window 116, are relatively small, polysilicon having excellent gap filling characteristics may preferably be used to fill the second opening 162 and the window 116.

Figure 17A:
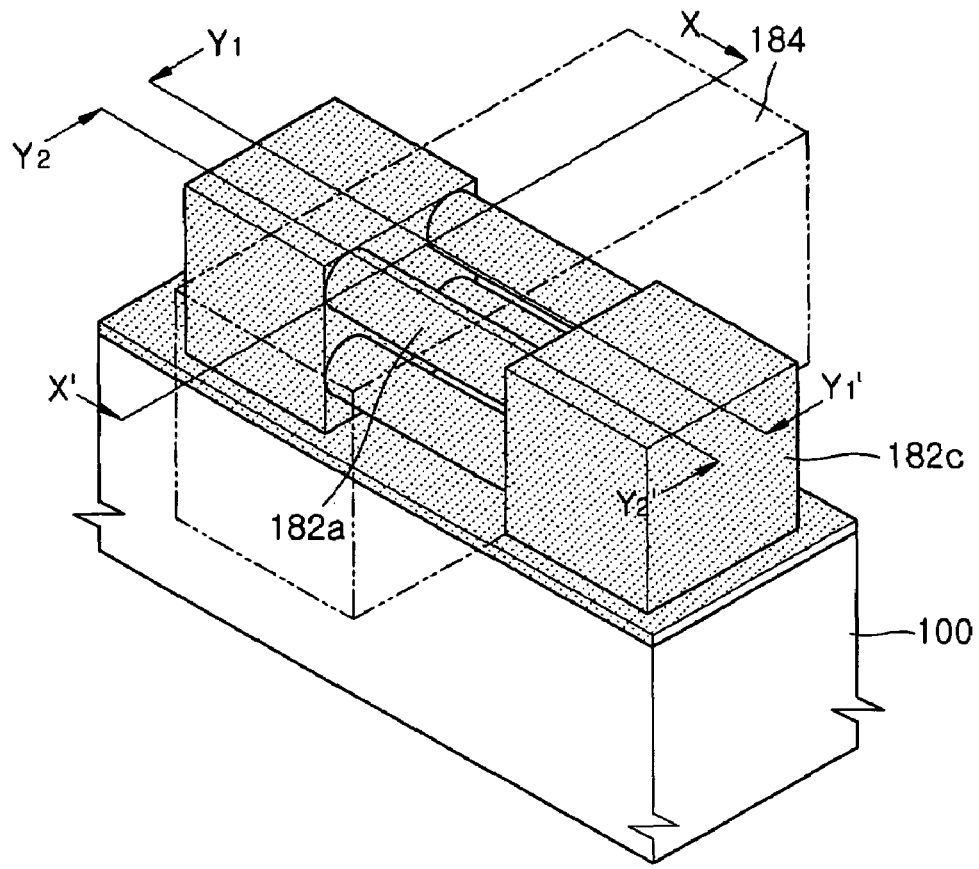
Figure 17B:
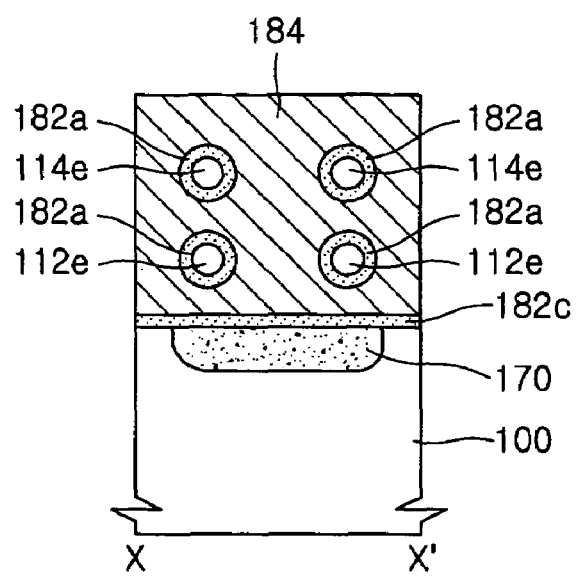
Figure 17C:
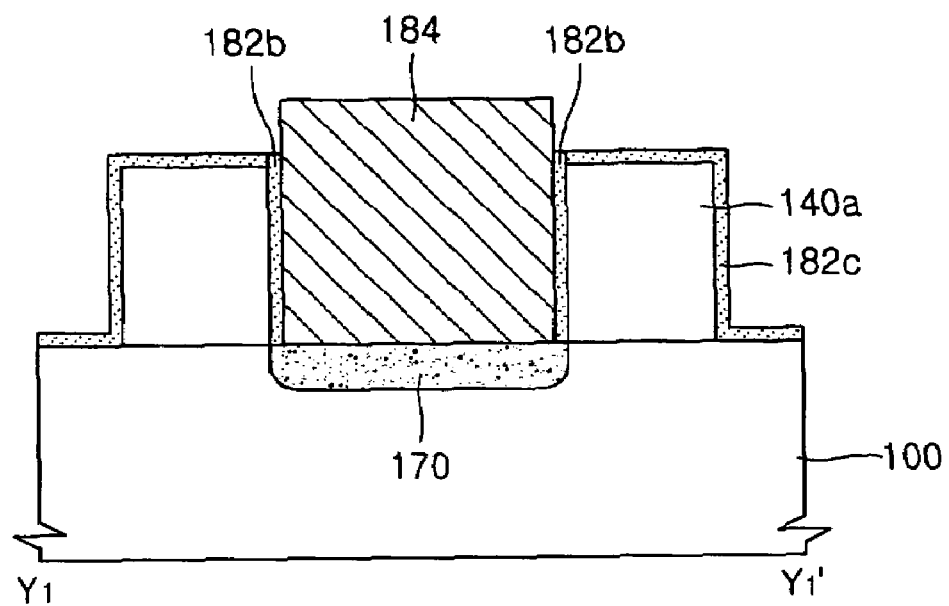
Figure 17D:
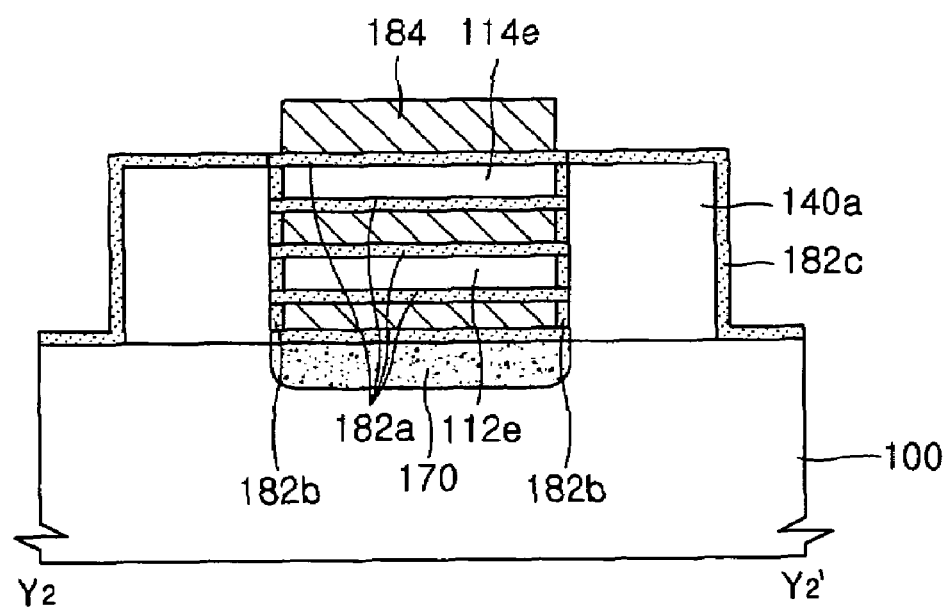

As shown in FIG. 17A, the conductive pattern 184 for use as a gate electrode may be formed to extend in the X-X' direction. The short-circuit prevention insulating layer 182b may be interposed between the conductive pattern 184 for use as a gate electrode and the source/drain patterns 140a. The short-circuit prevention insulating layer 182b prevents short-circuiting of a gate electrode and a source/drain regions of the FET. The short-circuit prevention insulating layer 182b may be an Si thermal oxide film formed simultaneously with the gate insulating film 182a, as described above, or may be an $SiO_2$ film (not shown) formed in a subsequent process of forming an interlayer insulating layer.

Alternatively, the short-circuit prevention insulating layer 182b may be a composite film of the Si thermal oxide film and the interlayer insulating film.

Although not illustrated, ions are implanted into the source/drain patterns 140a to define source/drain regions (142 of FIGS. 3C and 3D). If the source/drain patterns 140a are Si epitaxial layers, an ion implantation process is necessary. However, if the source/drain patterns 140a are formed of a conductive material, a separate ion implantation is not necessary. Depending on a recipe for the ion implantation, positions of bottom surfaces of the source/drain regions 142 may be controlled and/or a vertical doping profile can be made uniform. In this regard, the above-described gap may be provided between the source/drain regions 142 and the semiconductor substrate 100. During the ion implantation, the conductive pattern 184 for use as a gate electrode may be used as an implantation mask. Resultantly, an FET according to an embodiment of the present invention and as illustrated in FIGS. 17A-17D is formed.

FIGS. 18A through 21C illustrate stages in a method of fabricating an FET according to another embodiment of the present invention. Specifically, FIGS. 18A, 19A, 20A, and 21A illustrate schematic perspective views of the FET; FIGS. 18B, 19B, 20B, and 21B illustrate cross-sections taken along lines X-X' of FIGS. 18A, 19A, 20A, and 21A, respectively; and FIGS. 18C, 19C, 20C, and 21C illustrate cross-sections taken along lines $Y_1$-$Y_1$' of FIGS. 18A, 19A, 20A, and 21A, respectively.

Only differences between the present and previous embodiments will now be described.

Figure 18A:
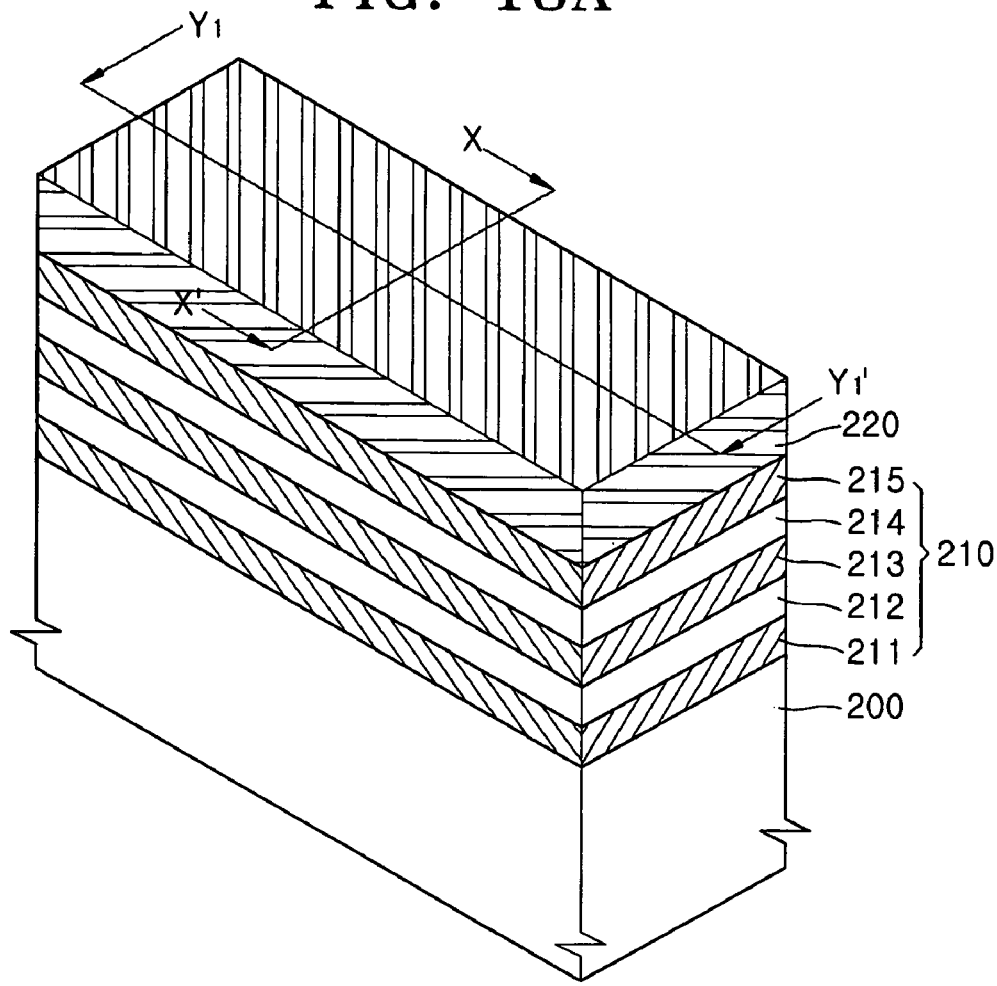
Figure 18B:
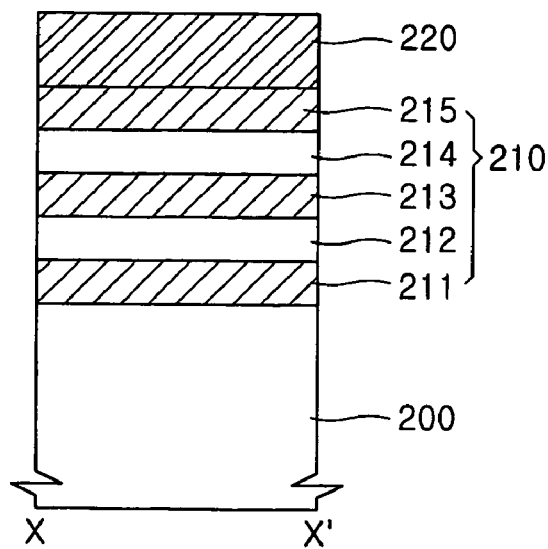
FIGS. 18B, 19B, 20B, and 21B illustrate cross-sections taken along line X-X' of FIGS. 18A, 19A, 20A, and 21A, respectively.
Figure 18C:
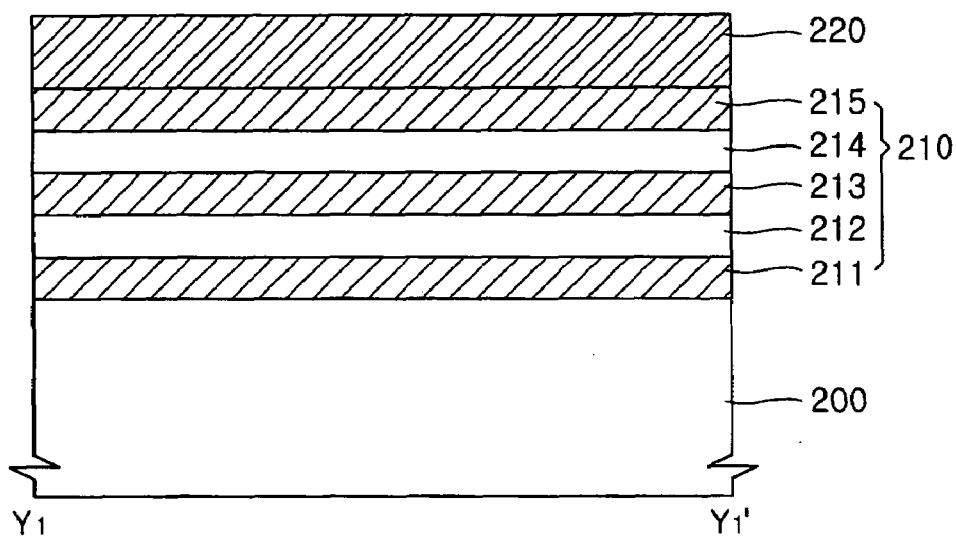

Referring to FIGS. 18A-18C, a channel forming preparation layer 210 and a hard mask layer 220 are sequentially formed on a semiconductor substrate 200. In this embodiment of the present invention, the channel forming preparation layer 210 includes a first sacrificial layer 211, a first channel layer 212, a second sacrificial layer 213, a second channel layer 214, and a third sacrificial layer 215, which are sequentially stacked on the semiconductor substrate 200. As in the previous embodiment, the channel forming preparation layer 210 includes two (2) channel layers, i.e., the first and second channel layers 212 and 214, thus, the present embodiment includes two rows of wire channels, as in the previous embodiment. In addition, however, the channel forming preparation layer 210 includes the third sacrificial layer 215. Accordingly, upper surfaces of wire channels in the uppermost row are formed lower than upper surfaces of source/drain patterns.

Figure 19A:
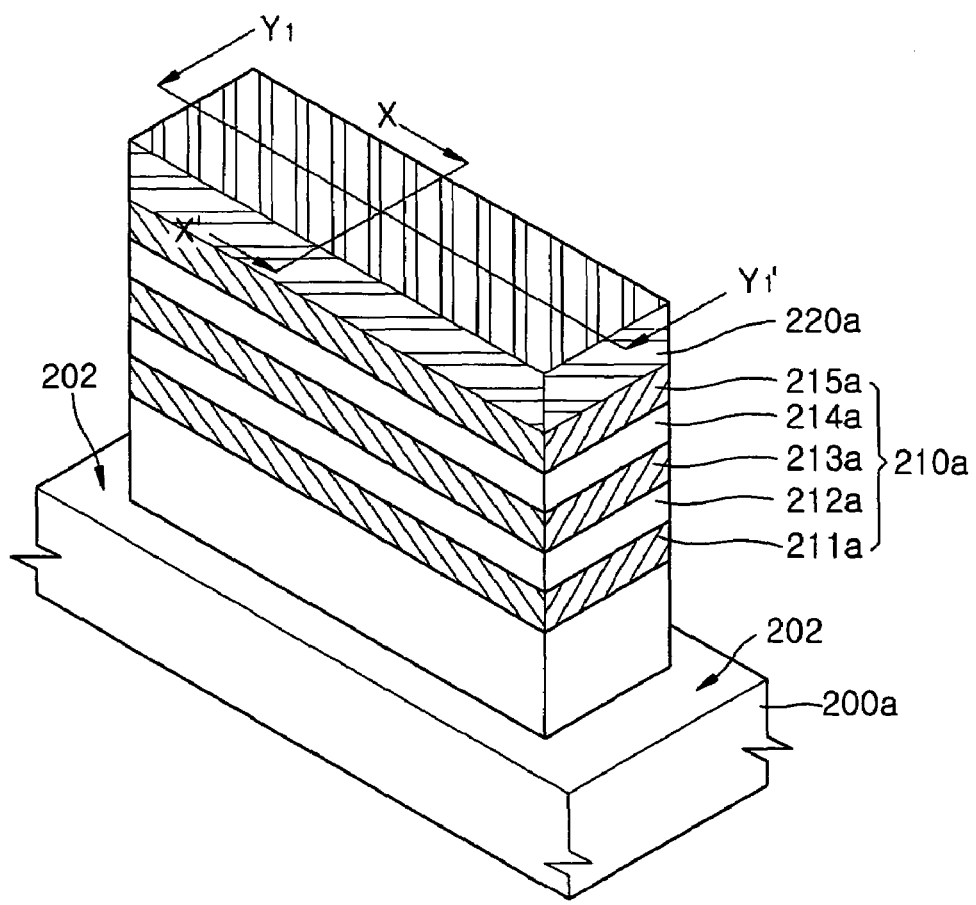
Figure 19B:
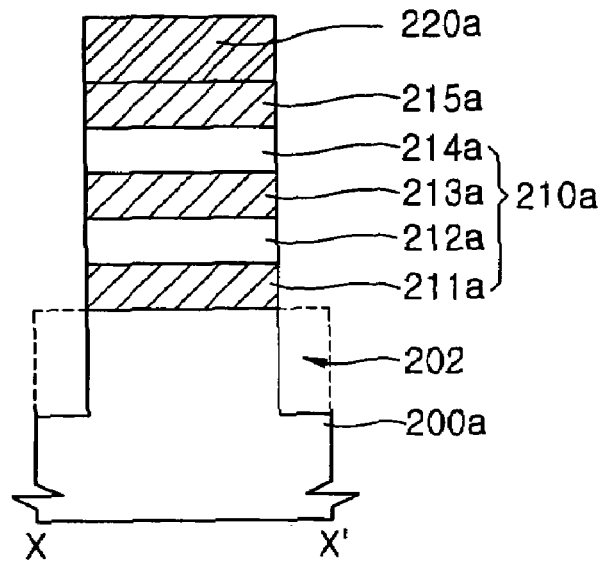
Figure 19C:
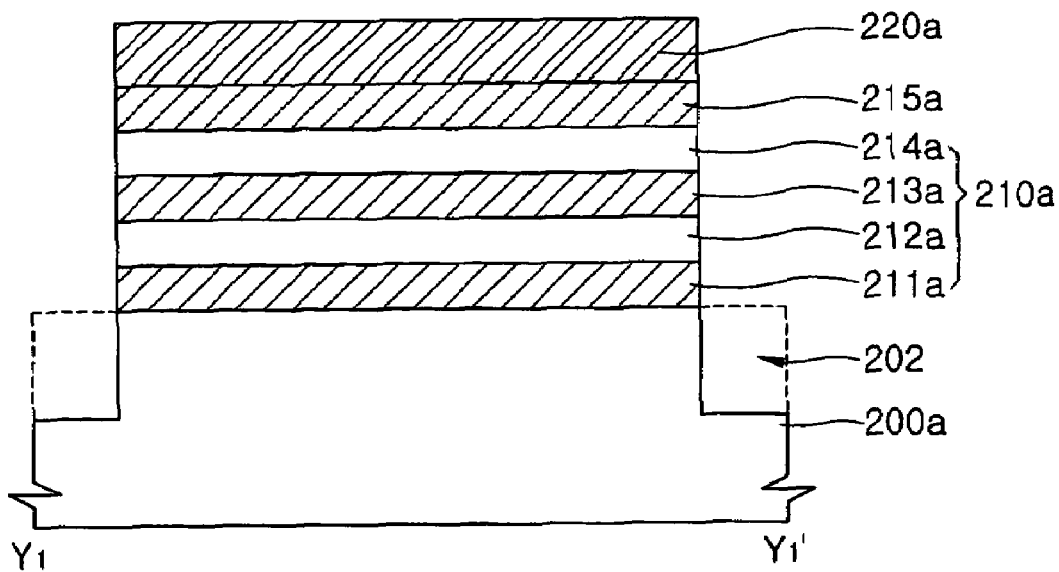

Referring to FIGS. 19A-19C, the hard mask layer 220, the channel forming preparation layer 210, and the semiconductor substrate 200 are sequentially patterned using photolithography to form a trench forming hard mask 220a, a channel forming preparation pattern 210a, and a semiconductor substrate 200a, respectively. The channel forming preparation pattern 210a includes a first sacrificial layer pattern 211a, a first channel layer pattern 212a, a second sacrificial layer pattern 213a, a second channel layer pattern 214a, and a third sacrificial layer pattern 215a. This patterning further forms a trench 202.

The above patterning may be performed in the following sequence. A photoresist pattern (not shown) defining the trench 202 is initially formed on the hard mask layer 220. The hard mask layer 220 is then etched using the photoresist pattern as an etch mask to form the trench forming hard mask 220a. Subsequently, the photoresist pattern is removed. Using the trench forming hard mask 220a as an etch mask, the channel forming preparation layer 210 and the semiconductor substrate 200 are sequentially etched. Resultantly, the channel forming preparation pattern 210a and the semiconductor substrate 200a, including the trench 202, are formed.

Figure 20A:
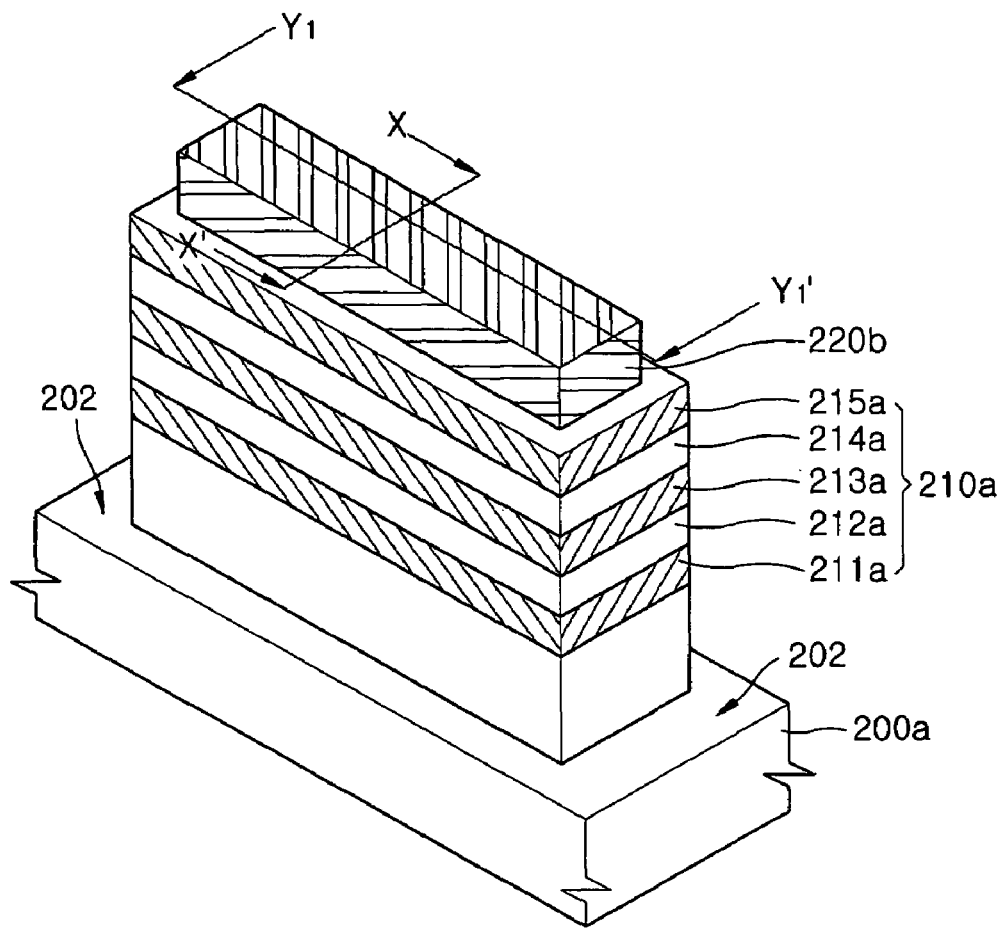
Figure 20B:
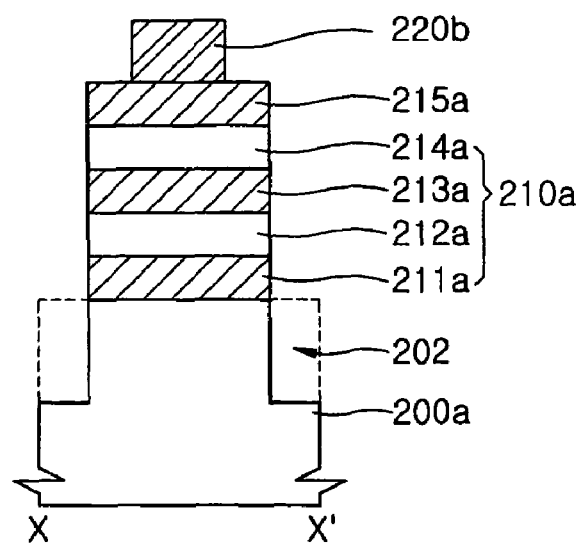
Figure 20C:
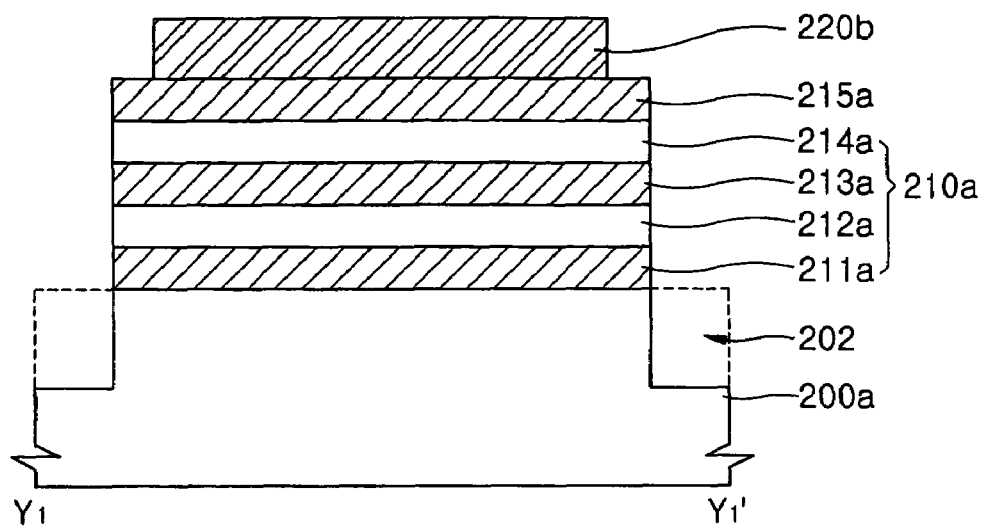

Referring to FIGS. 20A-20C, the trench forming hard mask 220a is patterned to form a mask pattern 220b. As described above, the mask pattern 220b is formed to expose at least edge portions of an upper surface of the channel forming preparation pattern 210a in the X-X' direction. A size and a thickness of the trench forming hard mask 220a may be recessed to a predetermined size by performing the isotropic etching as described above.

Figure 21A:
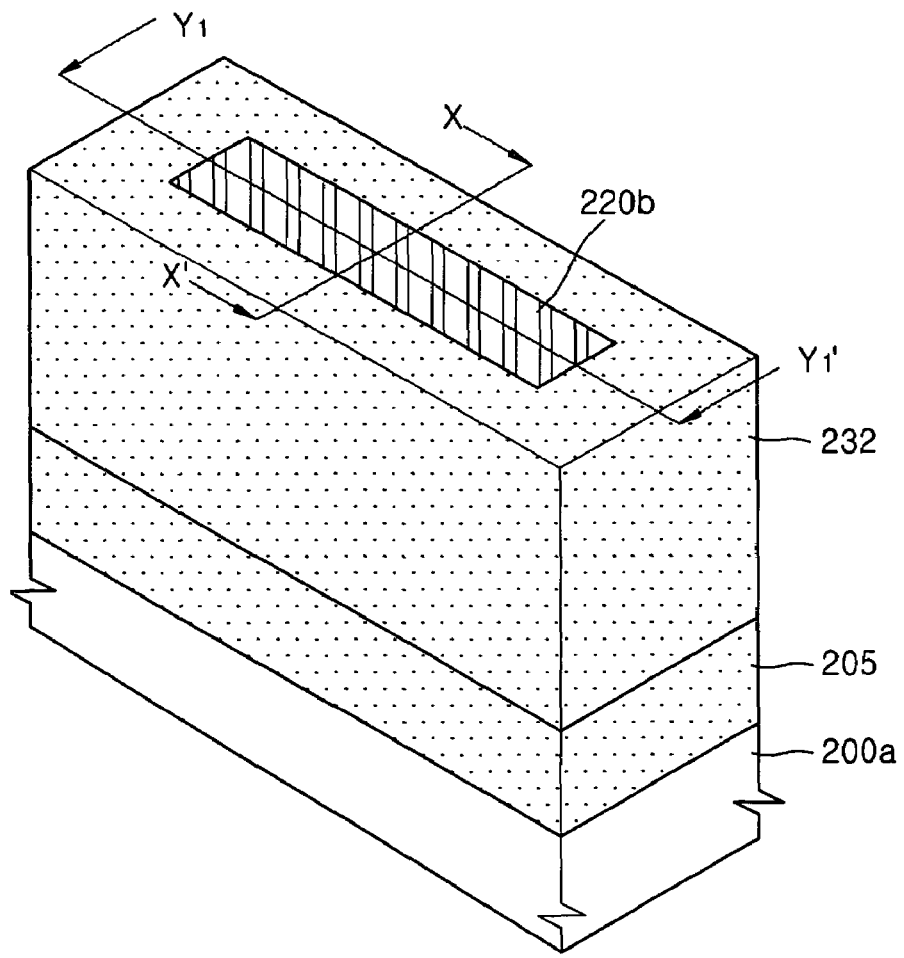
Figure 21B:
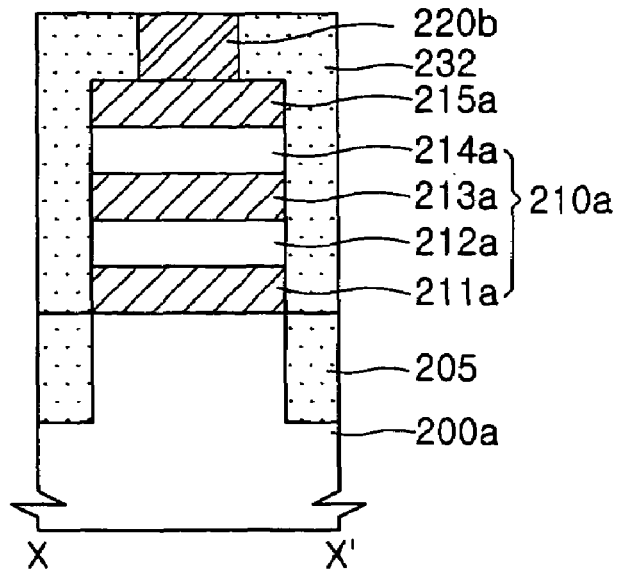
Figure 21C:
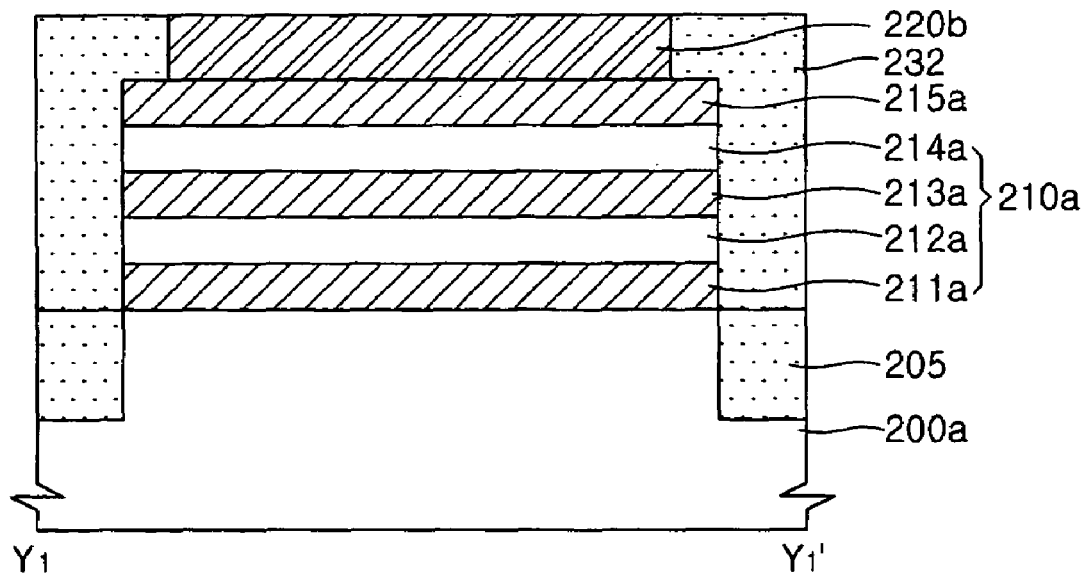

Referring to FIGS. 21A-21C, an entire surface of the resultant structure of FIGS. 20A-20C is coated with an insulating material having an excellent gap filling property, e.g., an HDP oxide film, and the coated insulating material film is planarized until the mask pattern 220b is exposed. Resultantly, an isolation insulating film 205 filling the trench 202 is formed on the semiconductor substrate 200a and a molded pattern 232, which surrounds the channel forming preparation pattern 210a and the mask pattern 220b, is formed on the isolation insulating film 205.

When subsequent processes are performed substantially as in the previously-described method of fabricating an FET, the FET illustrated in FIGS. 4A through 4D is obtained. Because the wire channels 212d and 214d of FIGS. 4A-4D have rectangular cross-sections, a primary annealing process for rounding the cross-sections of the wire channels 212d and 214d, as described above, may be omitted.

In the present embodiment, the trench forming hard mask 220a and the channel forming preparation pattern 210a may be formed simultaneously, and the isolation insulating film 205 and the molded pattern 232 may be formed simultaneously, thereby simplifying the method of fabricating the FET according to the present embodiment.

Further, in this embodiment of the present invention, the third sacrificial layer pattern 215a serves as a mask to protect the second channel layer pattern 214a during a process of removing a remaining molded pattern and a remaining buffer pattern, which processes correspond to the process illustrated in FIGS. 14A-14C of the previous embodiment. Accordingly, damage to the second channel layer pattern 214a, i.e., the upper row of wire channels 214d (as illustrated in FIGS. 4A-4D) can be prevented, thereby resulting in an FET having increased reliability.

According to the embodiments of the present invention, the wire channel of the FET is a complete depletion type and simultaneously has an isotropic structure. Thus, the property that carriers travel straight is improved, which prevents scattering.

Moreover, fast operation is possible and a large amount of current can flow in an FET according to an embodiment of the present invention. Furthermore, the number of wire channels can be easily increased, and a doping profile of a source/drain region can be made vertically uniform. Resultantly, a fast and reliable FET can be fabricated.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A field effect transistor (FET), comprising:
   a semiconductor substrate;
   source and drain regions formed on the semiconductor substrate;
   a plurality of wire channels electrically connected to the source and drain regions, the plurality of wire channels being arranged in two columns and at least two rows; and
   a gate dielectric layer surrounding each of the plurality of wire channels and a gate electrode surrounding the gate dielectric layer and each of the plurality of wire channels, wherein an upper surface of an uppermost row of the wire channels is level with an upper surface of the source and drain regions.

2. The FET as claimed in claim 1, wherein each of the plurality of wire channels in an uppermost row has a first size and each of the plurality of wire channels in a lowermost row has a second size, and the first size and the second size are different.

3. The FET as claimed in claim 2, wherein the first size is less than the second size.

4. The FET as claimed in claim 2, wherein the first size is greater than the second size.

5. The FET as claimed in claim 1, wherein the semiconductor substrate is monocrystalline silicon or a silicon-on-insulator (SOI) substrate.

6. The FET as claimed in claim 1, wherein each of the plurality of wire channels is formed of monocrystalline silicon.

7. The FET as claimed in claim 1, wherein the source and drain regions are formed of a material selected from the group consisting of monocrystalline silicon, polysilicon, metal, and metal silicide.

8. The FET as claimed in claim 1, wherein each of the plurality of wire channels has a substantially square shape.

9. The FET as claimed in claim 8, wherein a thickness of each of the plurality of wire channels is less than about 30 nm.

10. The FET as claimed in claim 1, wherein each of the plurality of wire channels has a substantially round shape.

11. The FET as claimed in claim 10, wherein each of the plurality of wire channels has a diameter of less than about 30 nm.

12. The FET as claimed in claim 1, wherein the number of rows of the plurality of wire channels is three.

13. The FET as claimed in claim 12, wherein a middle row has a third size, which is between the first size and the second size.

14. The FET as claimed in claim 12, wherein a size of each row of the plurality of wire channels is less than a size of a lower row of the plurality of wire channels and greater than a size of an upper row of the plurality of wire channels so that the plurality of wire channels in the uppermost row has the smallest size and the plurality of wire channels in the lowest row has the largest size.

15. The FET as claimed in claim 1, further comprising a channel formation preventing layer formed in an upper region of the semiconductor substrate between the source and drain regions, the channel formation preventing layer being operable to prevent operation of a bottom transistor.

16. The FET as claimed in claim 15, wherein the channel formation preventing layer is formed of an insulative material or an impurity-doped region of the semiconductor substrate.

17. The FET as claimed in claim 1, further comprising a short-circuit prevention insulating layer interposed between the source and drain regions and the gate electrode, the short-circuit prevention insulating layer being operable to prevent a short-circuit between the source and drain regions and the gate electrode.

18. The FET as claimed in claim 17, wherein the short-circuit prevention insulating layer is a silicon thermal oxide or a silicon oxide.

19. The FET as claimed in claim 1, wherein the source and drain regions are separated from the semiconductor substrate by a predetermined distance.

20. The FET as claimed in claim 1, wherein an upper surface of the uppermost row of wire channels is lower than an upper surface of the source and drain regions.

21. The FET as claimed in claim 1, wherein the gate dielectric layer is a silicon thermal oxide film.

22. The FET as claimed in claim 21, wherein the gate dielectric layer has a thickness of between about 50-100 Å.

23. The FET as claimed in claim 1, wherein the gate electrode is a single film formed of impurity-doped polysilicon, metal silicide, or metal impurity doped polysilicon.

24. The FET as claimed in claim 1, wherein the gate electrode is a composite film formed of at least two layers of impurity-doped polysilicon, metal silicide, or metal impurity.

25. A field effect transistor (FET), comprising:
a semiconductor substrate;
source and drain regions formed on the semiconductor substrate;
a plurality of wire channels formed of monocrystalline silicon, the plurality of wire channels electrically connected to the source and drain regions, the plurality of wire channels being arranged in two columns and at least one row; and
a gate dielectric layer surrounding each of the plurality of wire channels and a gate electrode surrounding the gate dielectric layer and each of the plurality of wire channels, wherein an upper surface of an uppermost row of the wire channels is level with an upper surface of the source and drain regions.

26. The FET as claimed in claim 25, wherein the semiconductor substrate is monocrystalline silicon or a silicon-on-insulator (SOI) substrate.

27. The FET as claimed in claim 25, wherein the source and drain regions are formed of a material selected from the group consisting of monocrystalline silicon, polysilicon, metal, and metal silicide.

28. The FET as claimed in claim 25, wherein each of the plurality of wire channels has a substantially square shape.

29. The FET as claimed in claim 28, wherein a thickness of each of the plurality of wire channels is less than about 30 nm.

30. The FET as claimed in claim 25, wherein each of the plurality of wire channels has a substantially round shape.

31. The FET as claimed in claim 30, wherein each of the plurality of wire channels has a diameter of less than about 30 nm.

32. The FET as claimed in claim 25, further comprising a channel formation preventing layer formed in an upper region of the semiconductor substrate between the source and drain regions, the channel formation preventing layer being operable to prevent operation of a bottom transistor.

33. The FET as claimed in claim 32, wherein the channel formation preventing layer is formed of an insulative material or an impurity-doped region of the semiconductor substrate.

34. The FET as claimed in claim 25, further comprising a short-circuit prevention insulating layer interposed between the source and drain regions and the gate electrode, the short-circuit prevention insulating layer being operable to prevent a short-circuit between the source and drain regions and the gate electrode.

35. The FET as claimed in claim 34, wherein the short-circuit prevention insulating layer is a silicon thermal oxide or a silicon oxide.

36. The FET as claimed in claim 25, wherein the source and drain regions are separated from the semiconductor substrate by a predetermined distance.

37. The FET as claimed in claim 25, wherein an upper surface of the uppermost row of wire channels is lower than an upper surface of the source and drain regions.

38. The FET as claimed in claim 25, wherein the gate dielectric layer is a silicon thermal oxide film.

39. The FET as claimed in claim 25, wherein the gate dielectric layer has a thickness of between about 50-100 Å.

40. The FET as claimed in claim 25, wherein the gate electrode is a single film formed of impurity-doped polysilicon, metal silicide, or metal impurity doped polysilicon.

41. The FET as claimed in claim 25, wherein the gate electrode is a composite film formed of at least two layers of impurity-doped polysilicon, metal silicide, or metal impurity.

* * * * *